United States Patent
Liu et al.

(10) Patent No.: US 11,482,586 B2
(45) Date of Patent: Oct. 25, 2022

(54) ARRAY SUBSTRATE HAVING GROUPS OF TRANSISTORS WITH SOURCE AND DRAIN ELECTRODE INDIFFERENT LAYERS

(71) Applicant: BOE Technology Group Co., Ltd., Beijing (CN)

(72) Inventors: Dongni Liu, Beijing (CN); Minghua Xuan, Beijing (CN); Liang Chen, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 214 days.

(21) Appl. No.: 16/769,214

(22) PCT Filed: Jul. 31, 2019

(86) PCT No.: PCT/CN2019/098622
§ 371 (c)(1),
(2) Date: Jun. 2, 2020

(87) PCT Pub. No.: WO2021/016927
PCT Pub. Date: Feb. 4, 2021

(65) Prior Publication Data
US 2021/0408202 A1    Dec. 30, 2021

(51) Int. Cl.
*H01L 29/08* (2006.01)
*H01L 27/32* (2006.01)

(52) U.S. Cl.
CPC ...... *H01L 27/3276* (2013.01); *H01L 27/3262* (2013.01); *H01L 27/3265* (2013.01); *H01L 2227/323* (2013.01)

(58) Field of Classification Search
CPC ............. H01L 27/3276; H01L 27/3262; H01L 27/3265; H01L 2227/323
USPC .......................................................... 257/40
See application file for complete search history.

(56) References Cited

U.S. PATENT DOCUMENTS

| | | | |
|---|---|---|---|
| 2008/0074401 A1* | 3/2008 | Chung | G06F 3/0421 345/175 |
| 2013/0335660 A1* | 12/2013 | Jung | G02F 1/133345 349/42 |
| 2017/0345877 A1* | 11/2017 | Hwang | H01L 27/3276 |
| 2018/0076240 A1 | 3/2018 | Takechi | |

(Continued)

FOREIGN PATENT DOCUMENTS

CN    107248393 A    10/2017

OTHER PUBLICATIONS

International Search Report & Written Opinion dated May 8, 2020, regarding PCT/CN2019/098622.

*Primary Examiner* — Phuc T Dang
(74) *Attorney, Agent, or Firm* — Intellectual Valley Law, P.C.

(57) ABSTRACT

An array substrate is provided. The array substrate includes a data line; a first voltage supply line; a second voltage supply line; and a pixel driving circuit. The pixel driving circuit includes one or more transistors in a first group and one or more transistors in a second group. A source electrode and a drain electrode of at least one transistor in the first group, the data line, the first voltage supply line, and the second voltage supply line are in a same layer. A source electrode and a drain electrode of at least one transistor in the second group are in a layer different from the first voltage supply line and the second voltage supply line.

18 Claims, 11 Drawing Sheets

(56) References Cited

U.S. PATENT DOCUMENTS

| 2018/0122877 A1* | 5/2018 | Beak | H01L 27/3248 |
| 2018/0151645 A1* | 5/2018 | Lee | H01L 27/3244 |
| 2018/0204897 A1 | 7/2018 | Zhou et al. | |

* cited by examiner

ARRAY SUBSTRATE HAVING GROUPS OF TRANSISTORS WITH SOURCE AND DRAIN ELECTRODE INDIFFERENT LAYERS

CROSS-REFERENCE TO RELATED APPLICATION

This application is a national stage application under 35 U.S.C. § 371 of International Application No. PCT/CN2019/098622, filed Jul. 31, 2019, the contents of which are incorporated by reference in the entirety.

TECHNICAL FIELD

The present invention relates to display technology, more particularly, to an array substrate, a display apparatus, and a method of fabricating an array substrate.

BACKGROUND

In recent years, miniaturized electro-optics devices are proposed and developed, including micro light emitting diode (micro LED). The micro LED-based display panels have the advantages of high brightness, high contrast ratio, fast response, and low power consumption. The micro LED-based display technology has found a wide range of applications in the display field, including smartphones and smart watches.

SUMMARY

In one aspect, the present invention provides an array substrate, comprising a data line; a first voltage supply line; a second voltage supply line; and a pixel driving circuit; wherein the pixel driving circuit comprises one or more transistors in a first group and one or more transistors in a second group; wherein a source electrode and a drain electrode of at least one transistor in the first group, the data line, the first voltage supply line, and the second voltage supply line are in a same layer; and a source electrode and a drain electrode of at least one transistor in the second group are in a layer different from the first voltage supply line and the second voltage supply line.

Optionally, the pixel driving circuit further comprises a storage capacitor; the storage capacitor comprises a first capacitor electrode, a second capacitor electrode, and an insulating layer between the first capacitor electrode and the second capacitor electrode; the second group comprises a driving transistor; the first capacitor electrode is connected to a gate electrode of the driving transistor; and the second capacitor electrode is connected to a voltage power source.

Optionally, the array substrate further comprises an inter-layer dielectric layer on a side of the second capacitor electrode away from the insulating layer, and in direct contact with the second capacitor electrode; wherein the first voltage supply line and the second voltage supply line, the source electrode and the drain electrode of the at least one transistor in the first group, and the data line are in direct contact with the inter-layer dielectric layer, and are on a side of the inter-layer dielectric layer away from the second capacitor electrode.

Optionally, the source electrode and the drain electrode of the at least one transistor in the first group, the data line, the second voltage supply line, the first voltage supply line, and a connecting electrode are in a same layer; the second group comprises an output transistor; and the connecting electrode connects a drain electrode of the output transistor in the second group to an anode contact pad.

Optionally, the array substrate further comprises an inter-layer dielectric layer on a side of the second capacitor electrode away from the insulating layer, and in direct contact with the second capacitor electrode; wherein the first voltage supply line, the second voltage supply line, the source electrode and the drain electrode of the at least one transistor in the first group, the data line, and the connecting electrode are in direct contact with the inter-layer dielectric layer, and are on a side of the inter-layer dielectric layer away from the second capacitor electrode.

Optionally, the array substrate further comprises a planarization layer on a side of the second voltage supply line and the first voltage supply line, the source electrode and the drain electrode of the at least one transistor in the first group, the data line, and the connecting electrode away from the inter-layer dielectric layer; a cathode contact pad on a side of the planarization layer away from the first voltage supply line, and extending through the planarization layer to connect to the first voltage supply line; and an anode contact pad on a side of the planarization layer away from the connecting electrode, and extending through the planarization layer to connect to the connecting electrode; wherein the planarization layer is in direct contact with the cathode contact pad and the anode contact pad on a first side, and is in direct contact with, on a second side opposite to the first side, the first voltage supply line, the second voltage supply line, the source electrode and the drain electrode of the at least one transistor in the first group, the data line, and the connecting electrode.

Optionally, the source electrode and the drain electrode of the at least one transistor in the second group are in a same layer as the second capacitor electrode.

Optionally, the source electrode and the drain electrode of the at least one transistor in the second group are in a same layer as an active layer of the at least one transistor in the second group, and are made of a semiconductor material.

Optionally, the pixel driving circuit comprises a current modulating sub-circuit and a duration modulating sub-circuit; wherein the current modulating sub-circuit is configured to generate a compensated current signal based on a data signal, and transmit the compensated current signal to the duration modulating sub-circuit; and the duration modulating sub-circuit is configured to receive the compensated current signal from the current modulating sub-circuit, and control an electrical component connected to the duration modulating sub-circuit based on time integration of the compensated current signal.

Optionally, the current modulating sub-circuit comprises the driving transistor; the storage capacitor; a first transistor having a gate electrode connected to a reset control signal line, a source electrode connected to a reset signal line, and a drain electrode connected to the first capacitor electrode and the gate electrode of the driving transistor; a second transistor having a gate electrode connected to a first gate line, a source electrode connected to the data line, and a drain electrode connected to a source electrode of the driving transistor; a third transistor having a gate electrode connected to the first gate line, a source electrode connected to the first capacitor electrode and the gate electrode of the driving transistor, and a drain electrode connected to a drain electrode of the driving transistor; a fourth transistor having a gate electrode connected to a light emitting control signal line, a source electrode connected to the second voltage supply line, and a drain electrode connected to the source electrode of the driving transistor and the drain electrode of the second transistor; and a fifth transistor having a gate electrode connected to the light emitting control signal line, a source electrode connected to drain electrodes of the driving transistor and the third transistor, and a drain electrode connected to the duration modulating sub-circuit; wherein the duration modulating sub-circuit comprises an output transistor having a source electrode connected to the drain electrode of the fifth transistor, and a drain electrode connected to a connecting electrode; a sixth transistor having a gate electrode connected to a second gate line, a source electrode connected to the data line, a drain electrode connected to a gate electrode of the output transistor; and a capacitor having a first electrode connected to the drain electrode of the sixth transistor and the gate electrode of the output transistor, and a second electrode configured to be provided with a common voltage.

Optionally, a source electrode and a drain electrode of any one of the driving transistor, the fourth transistor, the fifth transistor, and the output transistor are in a layer different from the first voltage supply line and the second voltage supply line.

Optionally, source electrodes and drain electrodes of the driving transistor, the fourth transistor, the fifth transistor, and the output transistor are in a layer different from the first voltage supply line and the second voltage supply line.

Optionally, the array substrate further comprises a micro light emitting diode (micro LED) connected to the pixel driving circuit.

Optionally, the array substrate further comprises an inter-layer dielectric layer on a side of the second capacitor electrode away from the insulating layer, and in direct contact with the second capacitor electrode; a planarization layer on a side of the first voltage supply line and the second voltage supply line, the source electrode and the drain electrode of the at least one transistor in the first group, the data line, and the connecting electrode away from the inter-layer dielectric layer; a cathode contact pad on a side of the planarization layer away from the first voltage supply line, and extending through the planarization layer to connect to the first voltage supply line; and an anode contact pad on a side of the planarization layer away from the connecting electrode, and extending through the planarization layer to connect to a connecting electrode; wherein the source electrode and the drain electrode of the at least one transistor in the first group, the data line, the second voltage supply line, the first voltage supply line, and the connecting electrode are in a same layer; the second group comprises an output transistor; the connecting electrode connects a drain electrode of the output transistor to the anode contact pad; the first voltage supply line and the second voltage supply line, the source electrode and the drain electrode of the at least one transistor in the first group, the data line, and the connecting electrode are in direct contact with the inter-layer dielectric layer, and are on a side of the inter-layer dielectric layer away from the second capacitor electrode; and the planarization layer is in direct contact with the cathode contact pad and the anode contact pad on a first side, and is in direct contact with, on a second side opposite to the first side, the first voltage supply line and the second voltage supply line, the source electrode and the drain electrode of the at least one transistor in the first group, the data line, and the connecting electrode; wherein the micro LED comprises a first type doped semiconductor layer, a second type doped semiconductor layer, a quantum-well layer connecting the first type doped semiconductor layer and the second type doped semiconductor layer, an N-pad electrically connected to the first type doped semiconductor layer, and a P-pad electrically connected to the second type doped semiconductor layer; wherein the N-pad is in direct contact with the cathode contact pad, and the P-pad is in direct contact with the anode contact pad.

In another aspect, the present invention provides a display apparatus, comprising the array substrate described herein or fabricated by a method described herein, and one or more integrated circuits connected to the array substrate In another aspect, the present invention provides a method of fabricating an array substrate, comprising forming a data line; forming a first voltage supply line; forming a second voltage supply line; and forming a pixel driving circuit; wherein forming the pixel driving circuit comprises forming one or more transistors in a first group and forming one or more transistors in a second group; wherein a source electrode and a drain electrode of at least one transistor in the first group, the data line, the second voltage supply line, and the first voltage supply line are formed in a same layer using a same material and a same mask plate; and a source electrode and a drain electrode of at least one transistor in the second group are formed in a layer different from the first voltage supply line and the second voltage supply line.

Optionally, forming the pixel driving circuit further comprises forming a storage capacitor; forming the storage capacitor comprises forming a first capacitor electrode, forming a second capacitor electrode, and forming an insulating layer, the insulating layer formed between the first capacitor electrode and the second capacitor electrode; the second group comprises a driving transistor; the first capacitor electrode is connected to a gate electrode of the driving transistor; and the second capacitor electrode is connected to a voltage power source.

Optionally, the method further comprises forming an anode contact pad; forming a cathode contact pad; and forming a connecting electrode that connects a drain electrode of an output transistor in the second group to an anode contact pad; wherein the source electrode and the drain electrode of the at least one transistor in the first group, the data line, the second voltage supply line, the first voltage supply line, and the connecting electrode are formed in a same layer using a same material and a same mask plate.

Optionally, the source electrode and the drain electrode of the at least one transistor in the second group, and the second capacitor electrode are formed in a same layer using a same material and a same mask plate.

Optionally, the source electrode and the drain electrode of the at least one transistor in the second group, and an active layer of the at least one transistor in the second group, are formed in a same layer using a same semiconductor material and a same mask plate.

Optionally, the method further comprises forming an inter-layer dielectric layer on a side of the second capacitor electrode away from the insulating layer, and in direct contact with the second capacitor electrode; forming a connecting electrode; forming a planarization layer on a side of the second voltage supply line and the first voltage supply line, the source electrode and the drain electrode of the at least one transistor in the first group, the data line, and the connecting electrode away from the inter-layer dielectric layer; forming a cathode contact pad on a side of the planarization layer away from the first voltage supply line, and extending through the planarization layer to connect to the first voltage supply line; forming an anode contact pad on a side of the planarization layer away from the connecting electrode, and extending through the planarization layer to connect to the connecting electrode; and forming a micro light emitting diode (micro LED) on a side of the cathode contact pad and the anode contact pad away from a base substrate; wherein the source electrode and the drain electrode of the at least one transistor in the first group, the data line, the second voltage supply line, the first voltage supply line, and the connecting electrode are formed in a same layer using a same material and a same mask plate; the second group comprises an output transistor; the connecting electrode connects a drain electrode of the output transistor to the anode contact pad; the first voltage supply line and the second voltage supply line, the source electrode and the drain electrode of the at least one transistor in the first group, the data line, and the connecting electrode are formed to be in direct contact with the inter-layer dielectric layer, and are formed on a side of the inter-layer dielectric layer away from the second capacitor electrode; and the planarization layer is formed to be in direct contact with the cathode contact pad and the anode contact pad on a first side, and is formed to be in direct contact with, on a second side opposite to the first side, the second voltage supply line and the first voltage supply line, the source electrode and the drain electrode of the at least one transistor in the first group, the data line, and the connecting electrode; wherein forming the micro LED comprises forming a micro LED precursor unit; wherein forming the micro LED precursor unit comprises forming a first type doped semiconductor layer, forming a second type doped semiconductor layer, a forming quantum-well layer connecting the first type doped semiconductor layer and the second type doped semiconductor layer, forming an N-pad electrically connected to the first type doped semiconductor layer, and forming a P-pad electrically connected to the second type doped semiconductor layer; wherein the method further comprises transferring the micro LED precursor unit on a side of the planarization layer away from the first voltage supply line and the connecting electrode; and bonding the N-pad to the cathode contact pad and bonding the P-pad to the anode contact pad; wherein the N-pad is in direct contact with the cathode contact pad, and the P-pad is in direct contact with the anode contact pad.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate, a display apparatus, and a method of fabricating an array substrate that substantially obviate one or more of the problems due to limitations and disadvantages of the related art. In one aspect, the present disclosure provides an array substrate. In some embodiments, the array substrate includes a data line; a first voltage supply line; a second voltage supply line; and a pixel driving circuit. In some embodiments, the pixel driving circuit includes one or more transistors in a first group and one or more transistors in a second group. Optionally, a source electrode and a drain electrode of at least one transistor in the first group, the data line, the first voltage supply line, and the second voltage supply line are in a same layer. Optionally, a source electrode and a drain electrode of at least one transistor in the second group are in a layer different from the first voltage supply line and the second voltage supply line.

In some embodiments, the pixel driving circuit further includes a storage capacitor. Optionally, the storage capacitor includes a first capacitor electrode, a second capacitor electrode, and an insulating layer between the first capacitor electrode and the second capacitor electrode. Optionally, the second group comprises a driving transistor. Optionally, the first capacitor electrode is connected to a gate electrode of the driving transistor; and the second capacitor electrode is connected to a voltage power source.

As used herein, the term "same layer" refers to the relationship between the layers simultaneously formed in the same step. In one example, the source electrode and the drain electrode of the at least one transistor in the first group, the data line, the second voltage supply line, the first voltage supply line are in a same layer when they are formed as a result of one or more steps of a same patterning process performed in a same layer of material. In another example, the source electrode and the drain electrode of the at least one transistor in the first group, the data line, the second voltage supply line, the first voltage supply line can be formed in a same layer by simultaneously performing the step of forming the source electrode and the drain electrode of the at least one transistor in the first group, the step of forming the data line, the step of forming the second voltage supply line, and the step of forming the first voltage supply line. The term "same layer" does not always mean that the thickness of the layer or the height of the layer in a cross-sectional view is the same.

Figure 1:
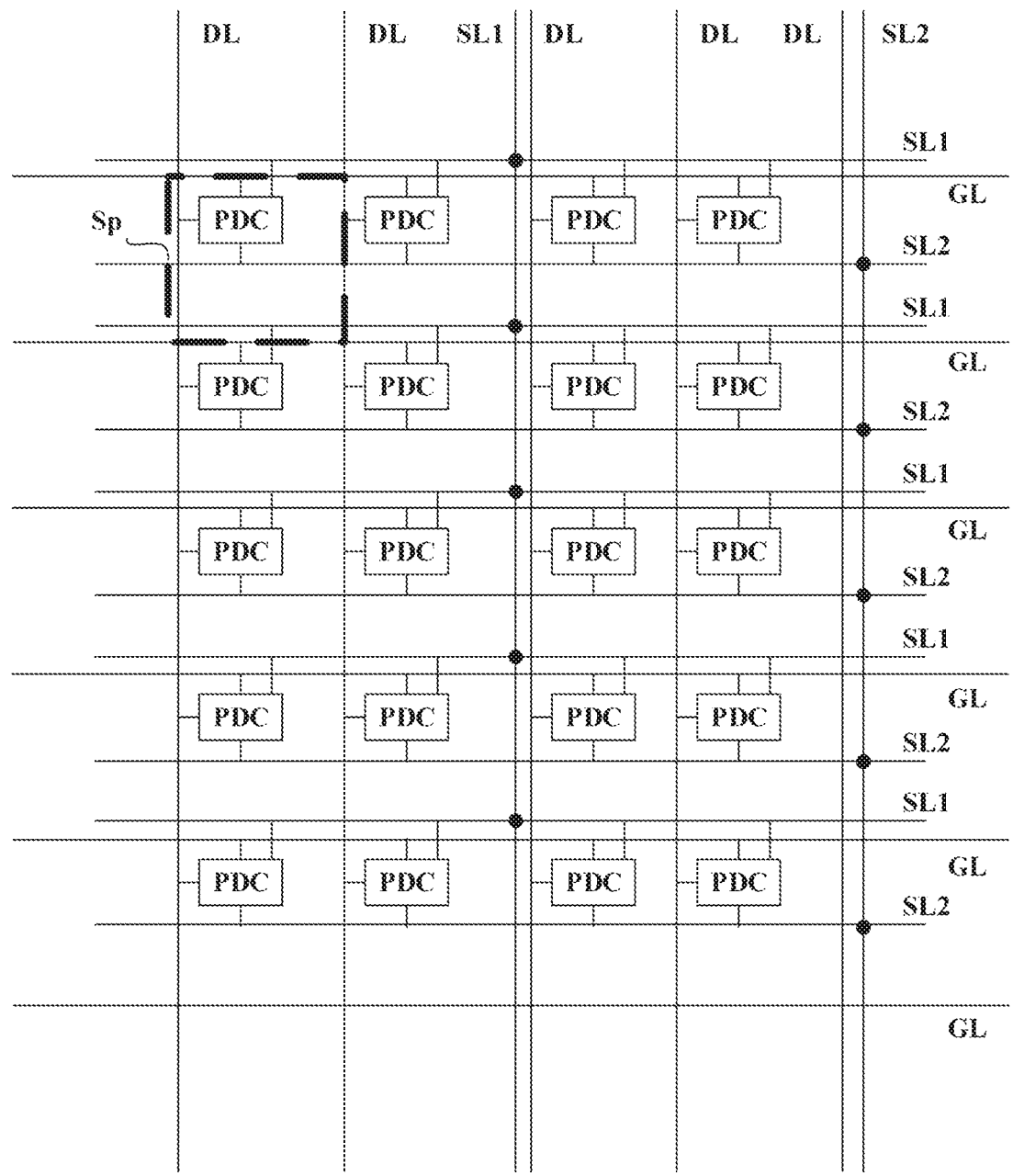
FIG. 1 is a plan view of an array substrate in some embodiments according to the present disclosure.

FIG. 1 is a plan view of an array substrate in some embodiments according to the present disclosure. Referring to FIG. 1, the array substrate includes an array of subpixels Sp. Each subpixel includes an electronic component, e.g., a light emitting element. In one example, the light emitting element is driven by a pixel driving circuit PDC. The array substrate includes a gate GL, a data line DL, a first voltage supply line SL1 (e.g., a low voltage supply line Vss) and a second voltage supply line SL2 (e.g., a high voltage supply line Vdd), each of which connected to the pixel driving circuit PDC. Light emission in a respective one of the subpixels Sp is driven by a pixel driving circuit PDC.

Figure 2:
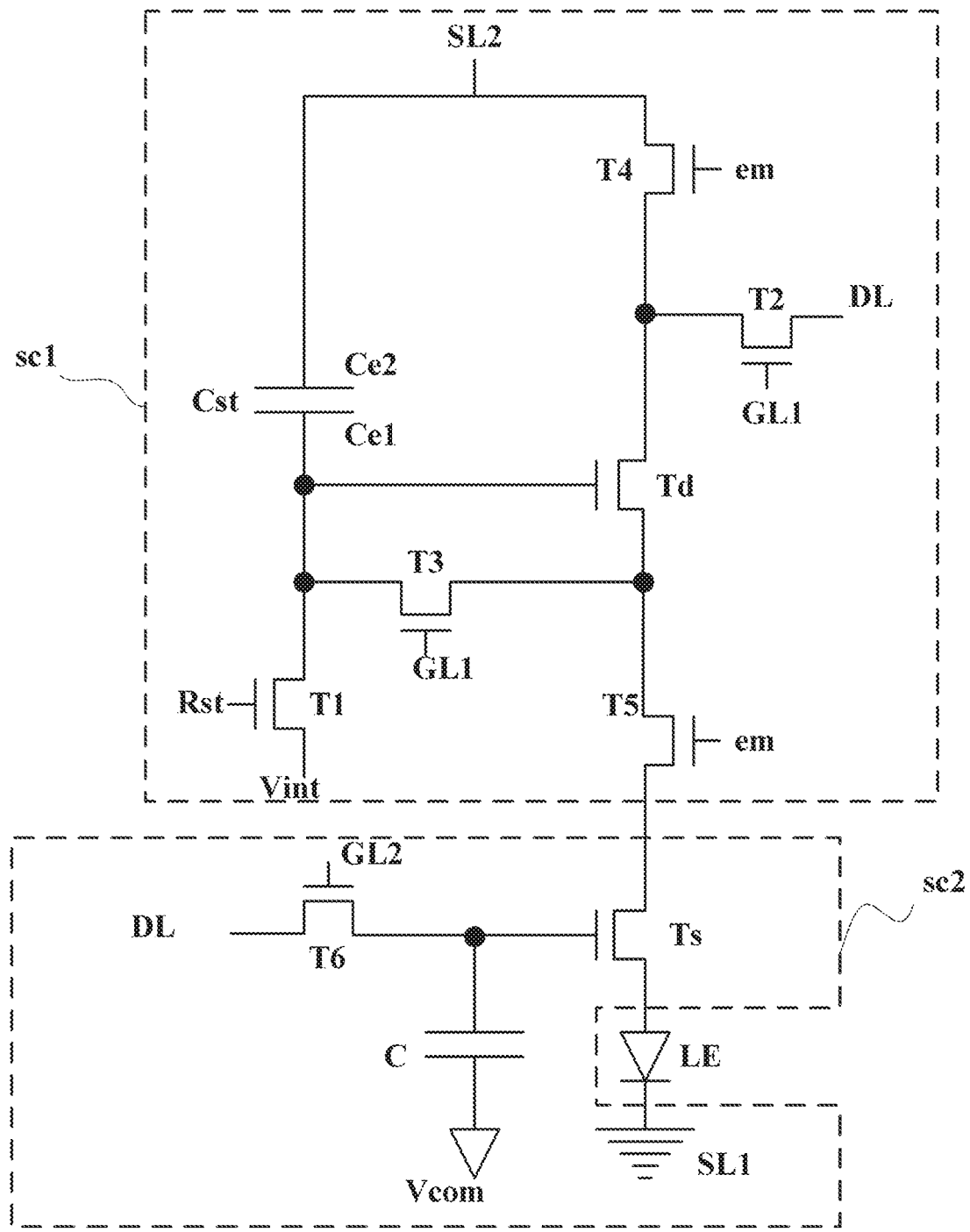
FIG. 2 is a circuit diagram illustrating the structure of a pixel driving circuit in some embodiments according to the present disclosure.

Various appropriate pixel driving circuits may be used in the present array substrate. Examples of appropriate driving circuits include 3T1C, 2T1C, 4T1C, 4T2C, 5T2C, 6T1C, 7T1C, 7T2C and 8T2C. In some embodiments, the respective one of the plurality of pixel driving circuits is a 3T1C driving circuit. FIG. 2 is a circuit diagram illustrating the structure of a pixel driving circuit in some embodiments according to the present disclosure. Referring to FIG. 2, in some embodiments, the pixel driving circuit includes a current modulating sub-circuit sc1 and a duration modulating sub-circuit sc2. In some embodiments, the current modulating sub-circuit sc1 is configured to generate a compensated current signal based on a data signal input into the current modulating sub-circuit sc1, and transmit the compensated current signal to the duration modulating sub-circuit sc2. In some embodiments, the duration modulating sub-circuit sc2 is configured to receive the compensated current signal from the current modulating sub-circuit sc1, and control an electrical component connected to the duration modulating sub-circuit sc2 based on time integration of the compensated current signal. In one example, the duration modulating sub-circuit sc2 is configured to receive the compensated current signal from the current modulating sub-circuit sc1, and control a grayscale value of light emitted from a light emitting element LE based on time integration of the compensated current signal. FIG. 2 shows a 6T1C circuit as the current modulating sub-circuit sc1.

Various appropriate light emitting elements may be used in the present array substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

In some embodiments, the current modulating sub-circuit sc1 includes the driving transistor Td; the storage capacitor Cst; a first transistor T1 having a gate electrode connected to a reset control signal line Rst, a source electrode connected to a reset signal line Vint, and a drain electrode connected to a first capacitor electrode Ce1 of the storage capacitor Cst and a gate electrode of the driving transistor Td; a second transistor T2 having a gate electrode connected to a first gate line GL1, a source electrode connected to the data line DL, and a drain electrode connected to a source electrode of the driving transistor Td; a third transistor T3 having a gate electrode connected to the first gate line GL1, a source electrode connected to the first capacitor electrode Ce1 of the storage capacitor Cst and the gate electrode of the driving transistor Td, and a drain electrode connected to a drain electrode of the driving transistor Td; a fourth transistor T4 having a gate electrode connected to a light emitting control signal line em, a source electrode connected to the second voltage supply line SL2, and a drain electrode connected to the source electrode of the driving transistor Td and the drain electrode of the second transistor T2; and a fifth transistor T5 having a gate electrode connected to the light emitting control signal line em, a source electrode connected to drain electrodes of the driving transistor Td and the third transistor T3, and a drain electrode connected to the duration modulating sub-circuit sc2. In some embodiments, the duration modulating sub-circuit sc2 includes a output transistor Ts having a source electrode connected to the drain electrode of the fifth transistor T5, and a drain electrode connected to a connecting electrode which is in turn connected to a P-pad of the light emitting element LE; a sixth transistor T6 having a gate electrode connected to a second gate line GL2, a source electrode connected to the data line DL, a drain electrode connected to a gate electrode of the output transistor Ts; and a capacitor C having a first electrode connected to the drain electrode of the sixth transistor T6 and the gate electrode of the output transistor Ts, and a second electrode configured to be provided with a common voltage Vcom.

In some embodiments, the one or more transistors in the first group are transistor(s) that is not turned on during the output period of the pixel driving circuit PDC, during which the pixel driving circuit PDC outputs an electrical signal to an electronic component driven by the pixel driving circuit PDC. For example, when the electronic component is a light emitting element LE, the one or more transistors in the first group are transistor(s) that is not turned on during the output period of the pixel driving circuit PDC, during which the pixel driving circuit PDC outputs an electrical signal to the light emitting element LE. Referring to FIG. 2, in one example, the one or more transistors in the first group include the first transistor T1, the second transistor T2, the third transistor T3, and the sixth transistor T6.

In some embodiments, the one or more transistors in the second group are transistor(s) that is turned on during an output period of the pixel driving circuit PDC, during which the pixel driving circuit PDC outputs an electrical signal to an electronic component driven by the pixel driving circuit PDC. For example, when the electronic component is a light emitting element LE, the one or more transistors in the second group are transistor(s) that is turned on during the output period of the pixel driving circuit PDC, during which the pixel driving circuit PDC outputs an electrical signal to the light emitting element LE. Referring to FIG. 2, in one example, the one or more transistors in the second group include the fourth transistor T4, the driving transistor Td, the fifth transistor T5, and the output transistor Ts.

In some embodiments, the one or more transistors in the first group has a first channel size, and the one or more transistors in the second group has a second channel size, wherein the second channel size is greater than the first channel size. As used herein, the term "channel size" in the context of the present disclosure refers to a channel dimension such as a channel width or a channel length, or a channel area, of the transistor. As used herein, the term "channel length" is intended to mean a dimension of a channel part of a transistor, wherein the dimension represents a minimum distance between a source electrode contact part and a drain electrode contact part. From a top view, the channel length is typically in a direction that is substantially perpendicular to channel-source interface, channel-drain interface, channel-source/drain interface, or the like. Optionally, the channel length describes the dimension of the channel part in a direction parallel to the designed direction of carrier flow when the channel part is "on". For example, the channel length can be the shortest distance from one source/drain region of a transistor to the other. As used herein, the term "channel width" is intended to mean a dimension of a channel part of a transistor, wherein the dimension is measured in a direction substantially perpendicular to the channel length. From a top view, the channel width typically extends from one channel region-field isolation region interface to an opposite channel region-field isolation region interface. Optionally, the channel width describes the dimension of the channel part in a direction perpendicular to the designed direction of carrier flow when the channel part is "on".

In some embodiments, when the channel size is a channel width or a channel length of the transistor, a ratio of the second channel size to the first channel size is in a range of 2 to 200, e.g., 2 to 5, 5 to 10, 10 to 20, 20 to 30, 30 to 40, 40 to 50, 50 to 60, 60 to 70, 70 to 80, 80 to 90, 90 to 100, 100 to 110, 110 to 120, 120 to 130, 130 to 140, 140 to 150, 150 to 160, 160 to 170, 170 to 180, 180 to 190, or 190 to 200. Optionally, when the channel size is a channel width or a channel length of the transistor, a ratio of the second channel size to the first channel size is in a range of 5 to 50. In some embodiments, when the channel size is a channel area of the transistor, a ratio of the second channel size to the first channel size is in a range of 5 to 500, e.g., 5 to 10, 10 to 50, 50 to 100, 100 to 150, 150 to 200, 200 to 250, 250 to 300, 300 to 350, 350 to 400, 400 to 450, or 450 to 500. Optionally, when the channel size is a channel area of the transistor, a ratio of the second channel size to the first channel size is in a range of 20 to 250.

In some embodiments, a channel width of a respective one of the one or more transistors in the first group is in a range of 2 μm to 50 μm, e.g., 2 μm to 4 μm, 4 μm to 6 μm, 6 μm to 8 μm, 8 μm to 10 μm, 10 μm to 15 μm, 15 μm to 20 μm, 20 μm to 25 μm, 25 μm to 30 μm, 30 μm to 35 μm, 35 μm to 40 μm, 40 μm to 45 μm, or 45 μm to 50 μm. In some embodiments, a channel length of a respective one of the one or more transistors in the first group is in a range of 2 μm to 50 μm, e.g., 2 μm to 4 μm, 4 μm to 6 μm, 6 μm to 8 μm, 8 μm to 10 μm, 10 μm to 15 μm, 15 μm to 20 μm, 20 μm to 25 μm, 25 μm to 30 μm, 30 μm to 35 μm, 35 μm to 40 μm, 40 μm to 45 μm, or 45 μm to 50 μm.

In some embodiments, a channel width of a respective one of the one or more transistors in the second group is in a range of 50 μm to 500 μm, e.g., 50 μm to 100 μm, 100 μm to 150 μm, 150 μm to 200 μm, 200 μm to 250 μm, 250 μm to 300 μm, 300 μm to 350 μm, 350 μm to 400 μm, 400 μm to 450 μm, or 450 μm to 500 μm. In some embodiments, a channel length of a respective one of the one or more transistors in the second group is in a range of 5 μm to 50 μm, e.g., 5 μm to 10 μm, 10 μm to 15 μm, 15 μm to 20 μm, 20 μm to 25 μm, 25 μm to 30 μm, 30 μm to 35 μm, 35 μm to 40 μm, 40 μm to 45 μm, or 45 μm to 50 μm.

In some embodiments, a channel width/channel length ratio of a respective one of the one or more transistors in the first group is in a range of 0.5 to 2, e.g., 0.5 to 1, 1 to 1.5, or 1.5 to 2. In some embodiments, a channel width/channel length ratio of a respective one of the one or more transistors in the second group is in a range of 2 to 50, e.g., 2 to 5, 5 to 10, 10 to 15, 15 to 20, 20 to 25, 25 to 30, 30 to 35, 35 to 40, 40 to 45, or 45 to 50.

In some embodiments, the one or more transistors in the first group has a first channel width/channel length ratio, and the one or more transistors in the second group has a second channel width/channel length ratio, wherein the second channel width/channel length ratio is greater than the first channel width/channel length ratio. Optionally, the second channel width/channel length ratio is greater than the first channel width/channel length ratio by a factor in a range of 2 to 50, e.g., 2 to 5, 5 to 10, 10 to 15, 15 to 20, 20 to 25, 25 to 30, 30 to 35, 35 to 40, 40 to 45, or 45 to 50.

In the context of the present disclosure, a respective one of the one or more transistors in the first group may be denoted as Ty. In the context of the present disclosure, a respective one of the one or more transistors in the second group may be denoted as Tx.

Optionally, a source electrode and a drain electrode of any one of the one or more transistors in the second group are in a layer different from the first voltage supply line SL1 and the second voltage supply line SL2. Optionally, source electrodes and drain electrodes of all of the one or more transistors in the second group are in a layer different from the first voltage supply line SL1 and the second voltage supply line SL2.

Optionally, a source electrode and a drain electrode of any one of the one or more transistors in the first group are in a same layer as the first voltage supply line SL1 and the second voltage supply line SL2. Optionally, source electrodes and drain electrodes of all of the one or more transistors in the first group are in a same layer as the first voltage supply line SL1 and the second voltage supply line SL2.

Figure 3:
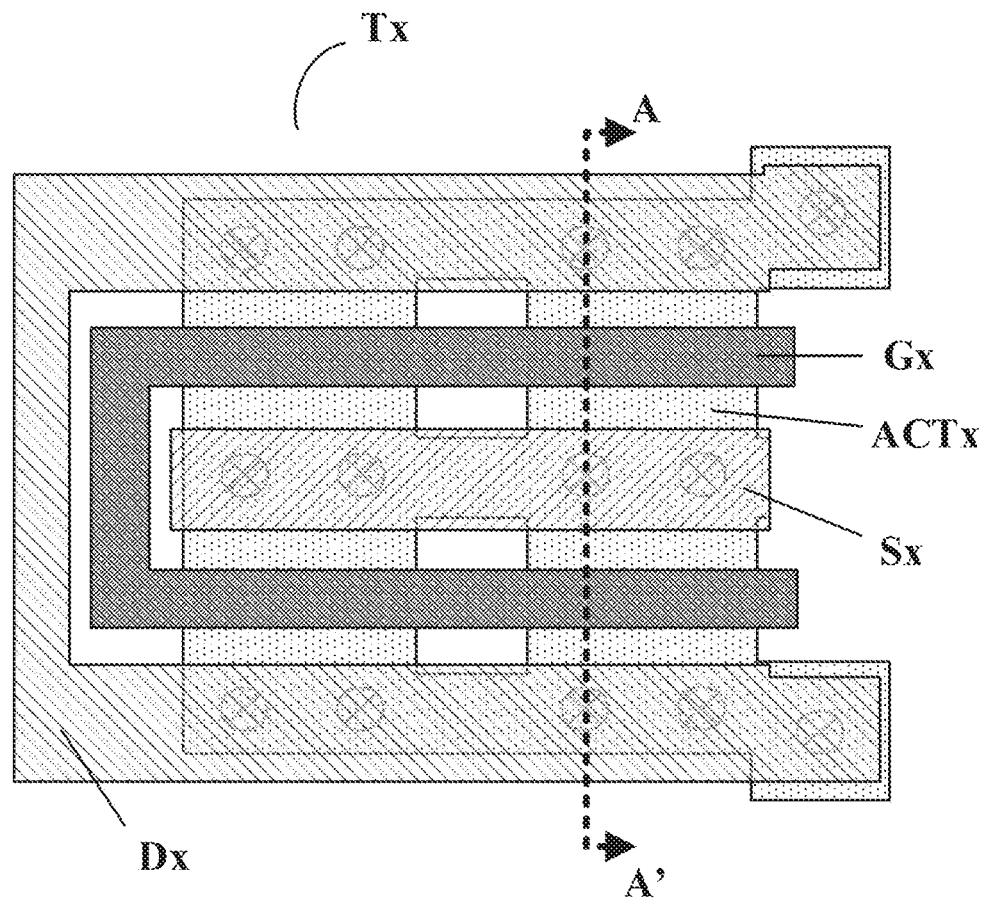
FIG. 3 is a plan view of one of transistors in a second group in some embodiments according to the present disclosure.
Figure 4:
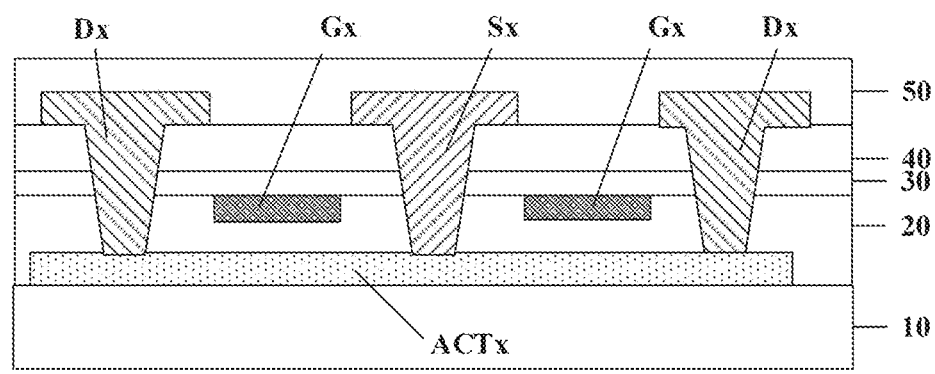
FIG. 4 is a cross-sectional view along an A-A' line in FIG. 3.

FIG. 3 is a plan view of a transistor in a second group in some embodiments according to the present disclosure. FIG. 4 is a cross-sectional view along an A-A' line in FIG. 3. Referring to FIG. 3 and FIG. 4, in some embodiments, Tx, one of the one or more transistors in the second group, includes a base substrate 10, an active layer ACTx on the base substrate 10, a gate insulating layer 20 on a side of the active layer ACTx away from the base substrate 10, a gate electrode Gx on a side of the gate insulating layer 20 away from the active layer ACTx, an insulating layer 30 on a side of the gate electrode Gx away from the base substrate 10, an inter-layer dielectric layer 40 on a side of the insulating layer 30 away from the base substrate 10, a source electrode Sx and a drain electrode Dx on a side of the inter-layer dielectric layer 40 away from the base substrate 10, and a planarization layer 50 on a side of the source electrode Sx and the drain electrode Dx away from the base substrate 10. Optionally, the drain electrode Dx has a U-shape with corners. In FIG. 4, the source electrode Sx and the drain electrode Dx respectively extend through the inter-layer dielectric layer 40, the insulating layer 30, and the gate insulating layer 20 to connect to the active layer ACTx.

Figure 5:
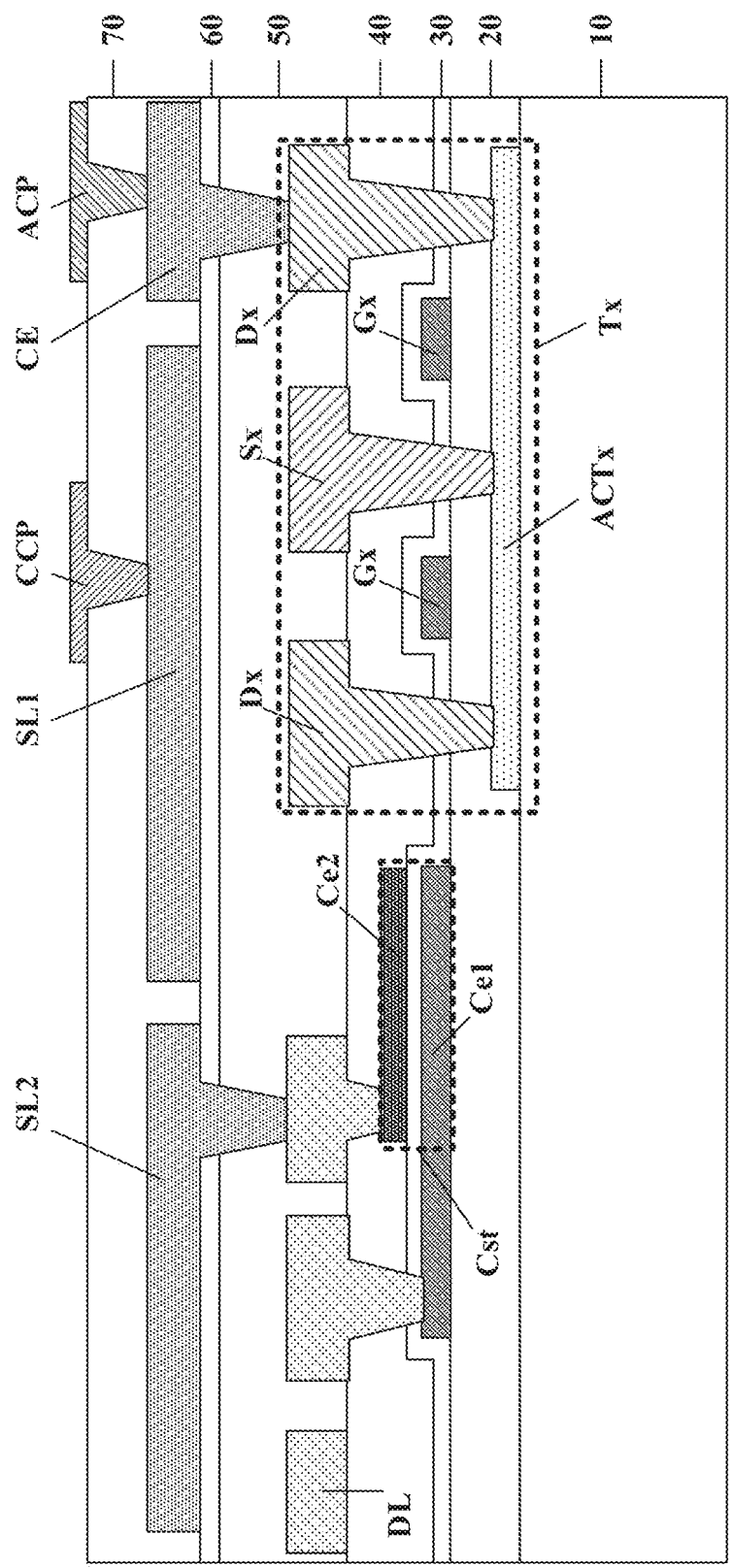
FIG. 5 is a cross-sectional view of a portion of an array substrate in some embodiments according to the present disclosure.

FIG. 5 is a cross-sectional view of a portion of an array substrate in some embodiments according to the present disclosure. FIG. 5 shows a portion of the array substrate having the transistor Tx. Referring to FIG. 5, the array substrate includes a base substrate 10; an active layer ACTx of the transistor Tx on the base substrate 10; a gate insulating layer 20 on a side of the active layer ACTx away from the base substrate 10; a gate electrode Gx of the transistor Tx and a first capacitor electrode Ce1 of the storage capacitor Cst on a side of the gate insulating layer 20 away from the active layer ACTx; an insulating layer 30 on a side of the gate electrode Gx and the first capacitor electrode Ce1 of the storage capacitor Cst away from the base substrate 10; a second capacitor electrode Ce2 of the storage capacitor Cst on a side of the insulating layer 30 away from the base substrate 10; an inter-layer dielectric layer 40 on a side of the second capacitor electrode Ce2 of the storage capacitor Cst away from the base substrate 10; a data line DL, a source electrode Sx and a drain electrode Dx of the transistor Tx on a side of the inter-layer dielectric layer 40 away from the base substrate 10; a planarization layer 50 on a side of the data line DL, the source electrode Sx and the drain electrode Dx away from the base substrate 10; a passivation layer 60 on a side of the planarization layer 50 away from the base substrate 10; a first voltage supply line SL1, a second voltage supply line SL2, and a connecting electrode CE on a side of the passivation layer 60 away from the base substrate 10; a second planarization layer 70 on a side of the first voltage supply line SL1, the second voltage supply line SL2, and the connecting electrode CE away from the base substrate 10; and an anode contact pad ACP and a cathode contact pad CCP on a side of the second planarization layer 70 away from the base substrate 10. The anode contact pad ACP extends through the second planarization layer 70 to connect to the connecting electrode CE, the connecting electrode CE extends through the passivation layer 60 and the planarization layer 50 to connect to the drain electrode Dx of the transistor Tx. The anode contact pad ACP and the cathode contact pad CCP are configured to be respectively in contact with a P-pad and an N-pad of a light emitting element such as a micro light emitting diode.

To ensure pixel driving capability of the pixel current, the transistors in the pixel driving circuit, especially the driving transistor, is made to have a relatively large width/length ratio (e.g., channel width/channel length ratio of a transistor), in order to achieve a better driving ability. For example, FIG. 3 and FIG. 4 illustrate an example of a transistor in the pixel driving circuit that has a relatively large width/length ratio. As shown in FIG. 5, in the layer having the data line DL, the source electrode Sx and the drain electrode Dx, the transistors occupy a relatively large area of the subpixel, resulting in a very limited unoccupied space. Accordingly, if the first voltage supply line SL1 and the second voltage supply line SL2 were to be disposed in the same layer as the data line DL, the source electrode Sx and the drain electrode Dx, the first voltage supply line SL1 and the second voltage supply line SL2 would have to be made to have very limited line widths. However, due to the relatively large driving current used in the array substrate (for example, one having a micro light emitting diode), there exists a relatively large IR drop in the first voltage supply line SL1 (e.g., a low voltage supply line Vss) and in the second voltage supply line SL2 (e.g., a high voltage supply line Vdd). The IR drop issue becomes particular severe when the first voltage supply line SL1 and the second voltage supply line SL2 have very limited line widths.

Due to the very limited unoccupied space left in the same layer having the data line DL, the source electrode Sx and the drain electrode Dx. and in view of the need for increasing the line widths of the first voltage supply line SL1 and the second voltage supply line SL2, in some embodiments (as shown in FIG. 5), the present disclosure in some embodiments disposes the first voltage supply line SL1 and the second voltage supply line SL2 in a layer different from the data line DL, the source electrode Sx and the drain electrode Dx. As shown in FIG. 5, the first voltage supply line SL1, the second voltage supply line SL2, and the connecting electrode CE are in a different layer, and on a side of the passivation layer 60 and the planarization layer 50 away from the data line DL, the source electrode Sx and the drain electrode Dx. Accordingly, the array substrate in FIG. 5 requires an additional mask plate and additional manufacturing costs associated with the additional mask plate process. Moreover, the array substrate in FIG. 5 has an increased thickness.

Figure 6:
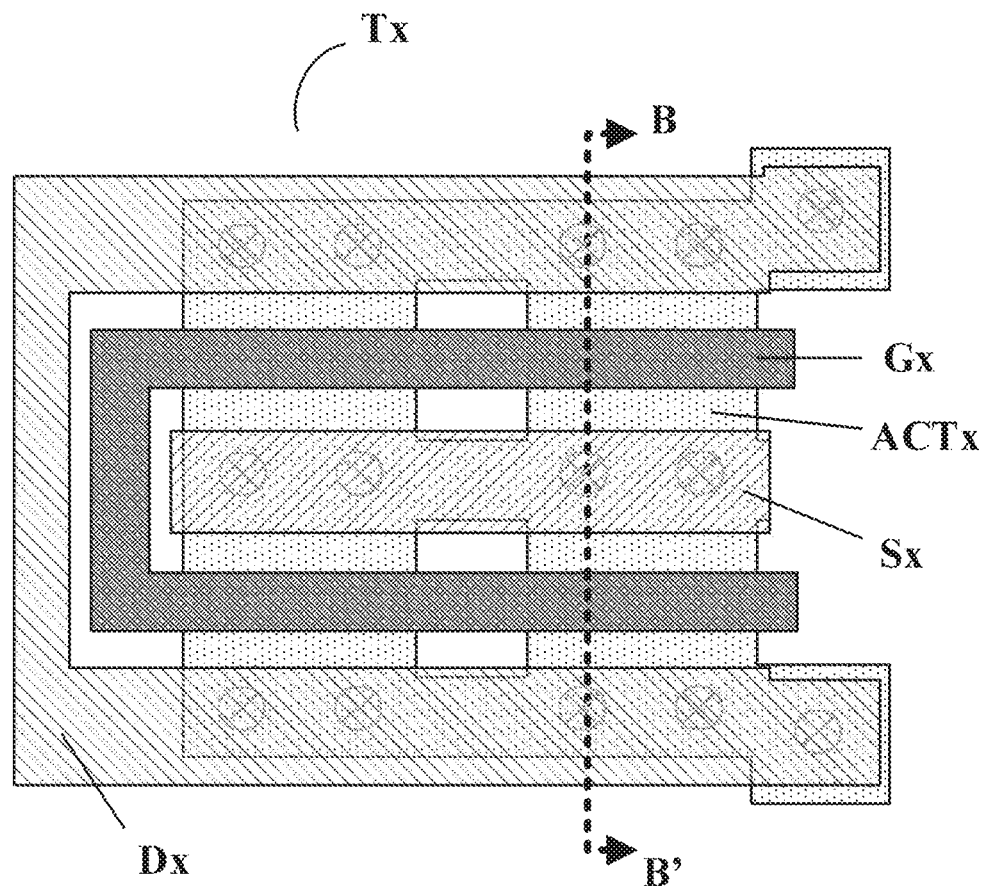
FIG. 6 is a plan view of one of transistors in a second group in some embodiments according to the present disclosure.
Figure 7:
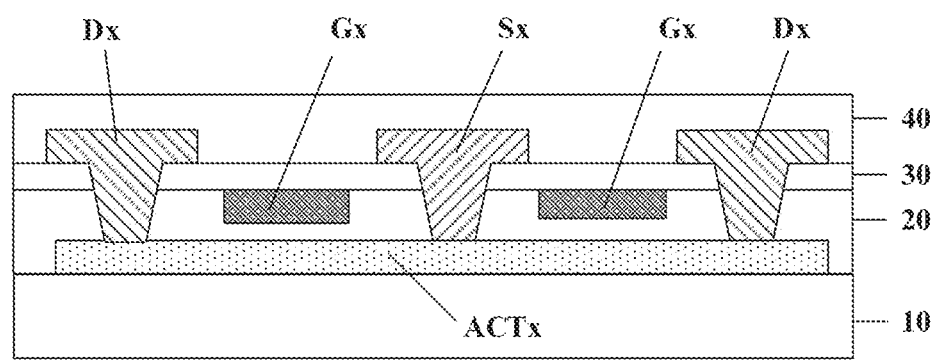
FIG. 7 is a cross-sectional view along a B-B' line in FIG. 6.

FIG. 6 is a plan view of a transistor in a second group in some embodiments according to the present disclosure. FIG. 7 is a cross-sectional view along a B-B' line in FIG. 6. Referring to FIG. 6 and FIG. 7, in some embodiments, Tx, one of the one or more transistors in the second group, includes a base substrate 10, an active layer ACTx on the base substrate 10, a gate insulating layer 20 on a side of the active layer ACTx away from the base substrate 10, a gate electrode Gx on a side of the gate insulating layer 20 away from the active layer ACTx, an insulating layer 30 on a side of the gate electrode Gx away from the base substrate 10, a source electrode Sx and a drain electrode Dx on a side of the insulating layer 30 away from the base substrate 10, and an inter-layer dielectric layer 40 on a side of the source electrode Sx and the drain electrode Dx away from the base substrate 10. Optionally, the drain electrode Dx has a U-shape with corners. In FIG. 6, the source electrode Sx and the drain electrode Dx respectively extend through the insulating layer 30 and the gate insulating layer 20 to connect to the active layer ACTx.

Figure 8:
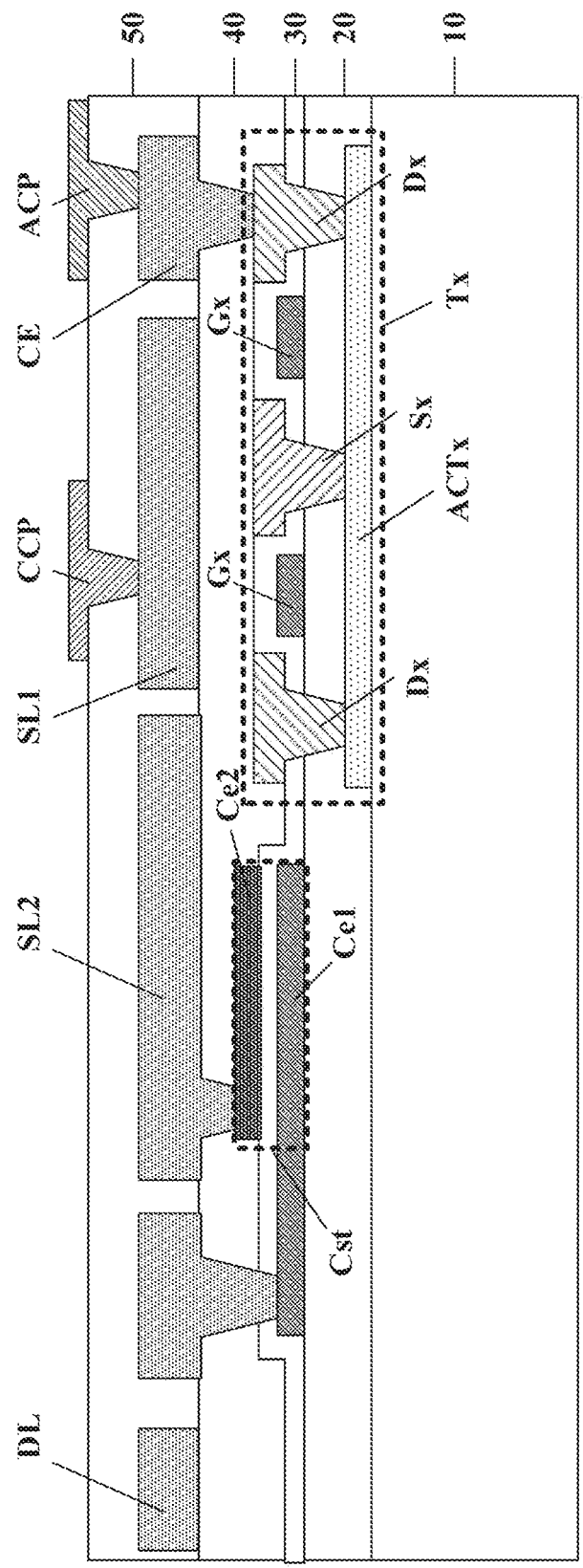
FIG. 8 is a cross-sectional view of a portion of an array substrate in some embodiments according to the present disclosure.

FIG. 8 is a cross-sectional view of a portion of an array substrate in some embodiments according to the present disclosure. FIG. 8 shows a portion of the array substrate having the transistor Tx. Referring to FIG. 8, the array substrate includes a base substrate 10; an active layer ACTx of the transistor Tx on the base substrate 10; a gate insulating layer 20 on a side of the active layer ACTx away from the base substrate 10; a gate electrode Gx of the transistor Tx and a first capacitor electrode Ce1 of the storage capacitor Cst on a side of the gate insulating layer 20 away from the active layer ACTx; an insulating layer 30 on a side of the gate electrode Gx and the first capacitor electrode Ce1 of the storage capacitor Cst away from the base substrate 10; a second capacitor electrode Ce2 of the storage capacitor Cst, a source electrode Sx and a drain electrode Dx of the transistor Tx on a side of the insulating layer 30 away from the base substrate 10; an inter-layer dielectric layer 40 on a side of the second capacitor electrode Ce2 of the storage capacitor Cst, the source electrode Sx and the drain electrode Dx of the transistor Tx away from the base substrate 10; a data line DL, a first voltage supply line SL1, a second voltage supply line SL2, and a connecting electrode CE on a side of the inter-layer dielectric layer 40 away from the base substrate 10; a planarization layer 50 on a side of the data line DL, the first voltage supply line SL1, the second voltage supply line SL2, and the connecting electrode CE away from the base substrate 10; and an anode contact pad ACP and a cathode contact pad CCP on a side of the planarization layer 50 away from the base substrate 10. The anode contact pad ACP extends through the planarization layer 50 to connect to the connecting electrode CE, the connecting electrode CE extends through the inter-layer dielectric layer 40 to connect to the drain electrode Dx of the transistor Tx. The anode contact pad ACP and the cathode contact pad CCP are configured to be respectively in contact with a P-pad and an N-pad of a light emitting element such as a micro light emitting diode. In FIG. 8, the source electrode Sx and the drain electrode Dx of the transistor Tx (e.g., the at least one of the one or more transistors in a second group) are in a same layer as the second capacitor electrode Ce2.

Figure 9:
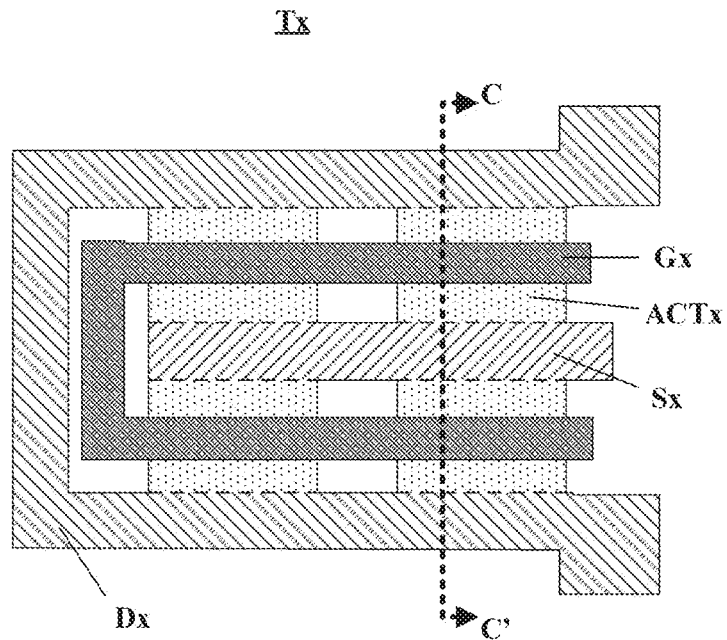
FIG. 9 is a plan view of a transistor in a second group in some embodiments according to the present disclosure.
Figure 10:
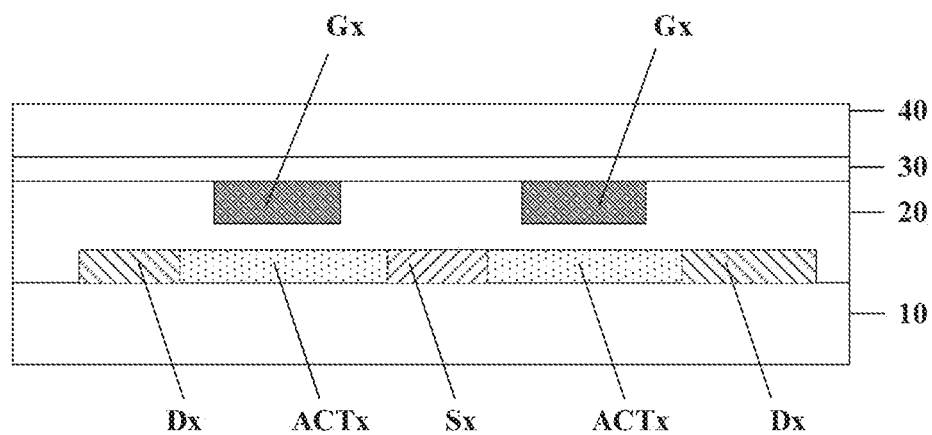
FIG. 10 is a cross-sectional view along a C-C' line in FIG. 9.

FIG. 9 is a plan view of a transistor in a second group in some embodiments according to the present disclosure. FIG. 10 is a cross-sectional view along a C-C' line in FIG. 9.

Referring to FIG. 9 and FIG. 10, in some embodiments, Tx, one of the one or more transistors in a second group, includes a base substrate 10, an active layer ACTx, a source electrode Sx and a drain electrode Dx on the base substrate 10, a gate insulating layer 20 on a side of the active layer ACTx, the source electrode Sx and the drain electrode Dx, away from the base substrate 10, a gate electrode Gx on a side of the gate insulating layer 20 away from the active layer ACTx, an insulating layer 30 on a side of the gate electrode Gx away from the base substrate 10, and an inter-layer dielectric layer 40 on a side of the insulating layer 30 away from the base substrate 10. In some embodiments, as shown in FIG. 10, the source electrode Sx and the drain electrode Dx, and the active layer ACTx are parts of a unitary structure. In some embodiments, the source electrode Sx and the drain electrode Dx of the at least one of the one or more transistors in a second group are in a same layer as an active layer ACTx of the at least one of the one or more transistors in a second group, and are made of a semiconductor material. In one example, a semiconductor material layer is first deposited on the base substrate 10, the semiconductor material layer is then patterned to form a second semiconductor material layer corresponding to the source electrode Sx, the drain electrode Dx, and the active layer ACTx. Subsequently, in one example, the regions of the second semiconductor material layer corresponding to the source electrode Sx and the drain electrode Dx are treated (e.g., by doping) to make them more conductive, thereby forming the source electrode Sx, the drain electrode Dx, and the active layer ACTx.

Figure 11:
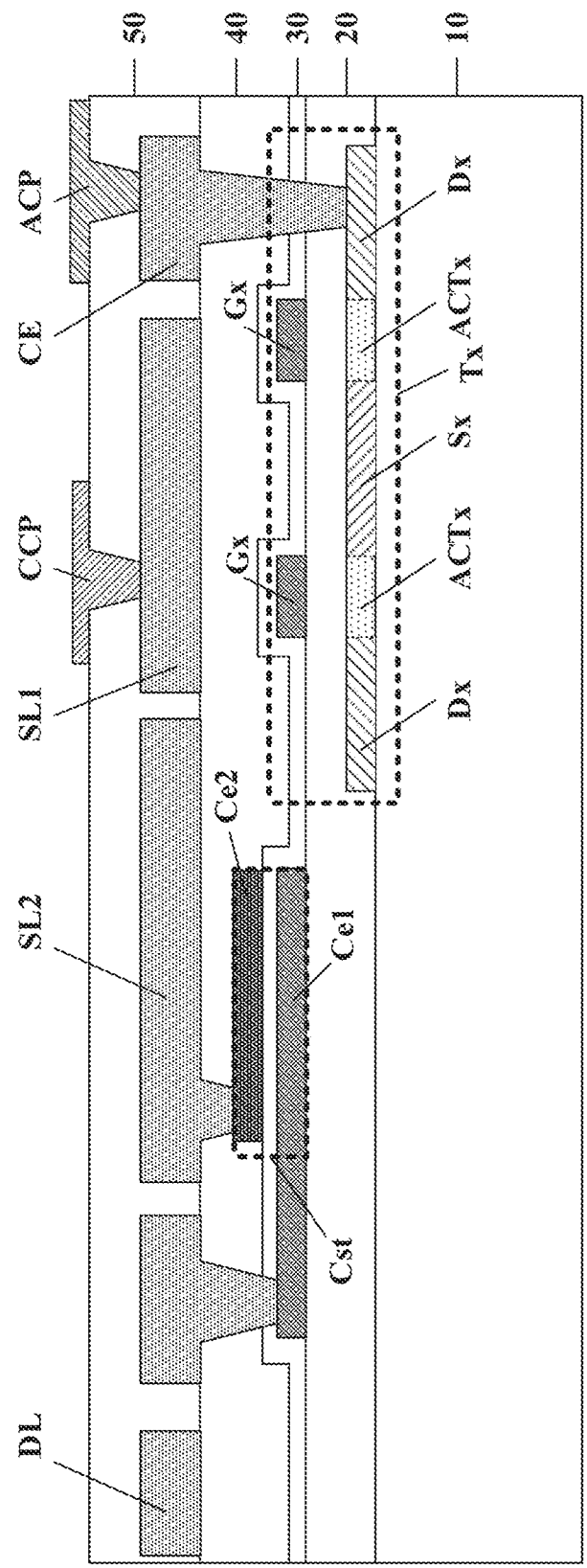
FIG. 11 is a cross-sectional view of a portion of an array substrate in some embodiments according to the present disclosure.

FIG. 11 is a cross-sectional view of a portion of an array substrate in some embodiments according to the present disclosure. FIG. 11 shows a portion of the array substrate having the transistor Tx. Referring to FIG. 11, the array substrate includes a base substrate 10; an active layer ACTx, a source electrode Sx, and a drain electrode Dx of the transistor Tx on the base substrate 10; a gate insulating layer 20 on a side of the active layer ACTx, the source electrode Sx, and the drain electrode Dx away from the base substrate 10; a gate electrode Gx of the transistor Tx and a first capacitor electrode Ce1 of the storage capacitor Cst on a side of the gate insulating layer 20 away from the active layer ACTx; an insulating layer 30 on a side of the gate electrode Gx and the first capacitor electrode Ce1 of the storage capacitor Cst away from the base substrate 10; a second capacitor electrode Ce2 of the storage capacitor Cst on a side of the insulating layer 30 away from the base substrate 10; an inter-layer dielectric layer 40 on a side of the second capacitor electrode Ce2 of the storage capacitor Cst away from the base substrate 10; a data line DL, a first voltage supply line SL1, a second voltage supply line SL2, and a connecting electrode CE on a side of the inter-layer dielectric layer 40 away from the base substrate 10, a planarization layer 50 on a side of the data line DL, the first voltage supply line SL1, the second voltage supply line SL2, and the connecting electrode CE away from the base substrate 10; and an anode contact pad ACP and a cathode contact pad CCP on a side of the planarization layer 50 away from the base substrate 10. The anode contact pad ACP extends through the planarization layer 50 to connect to the connecting electrode CE. The connecting electrode CE extends through the inter-layer dielectric layer 40, the insulating layer 30, and the gate insulating layer 20 to connect to the drain electrode Dx of the transistor Tx. The anode contact pad ACP and the cathode contact pad CCP are configured to be respectively in contact with a P-pad and an N-pad of a light emitting element such as a micro light emitting diode.

Comparing the array substrates in FIG. 8 and FIG. 11 with the array substrate in FIG. 5, the array substrates in FIG. 8 and FIG. 11 dispose the source electrode Sx and the drain electrode Dx of the transistor Tx in a layer different from the data line DL. Accordingly, the layer having the data line DL has sufficient space for laying out the first voltage supply line SL1, the second voltage supply line SL2, and the connecting electrode CE. Moreover, the first voltage supply line SL1 and the second voltage supply line SL2 may have a relatively large line width to decrease IR drop. The source electrode Sx and the drain electrode Dx of the transistor Tx are formed either in a same layer as the second capacitor electrode Ce2 (FIG. 8) or in a same layer as the active layer ACTx (FIG. 11), no additional mask plate is required as compared to the array substrate in FIG. 5, saving manufacturing costs.

Figure 12:
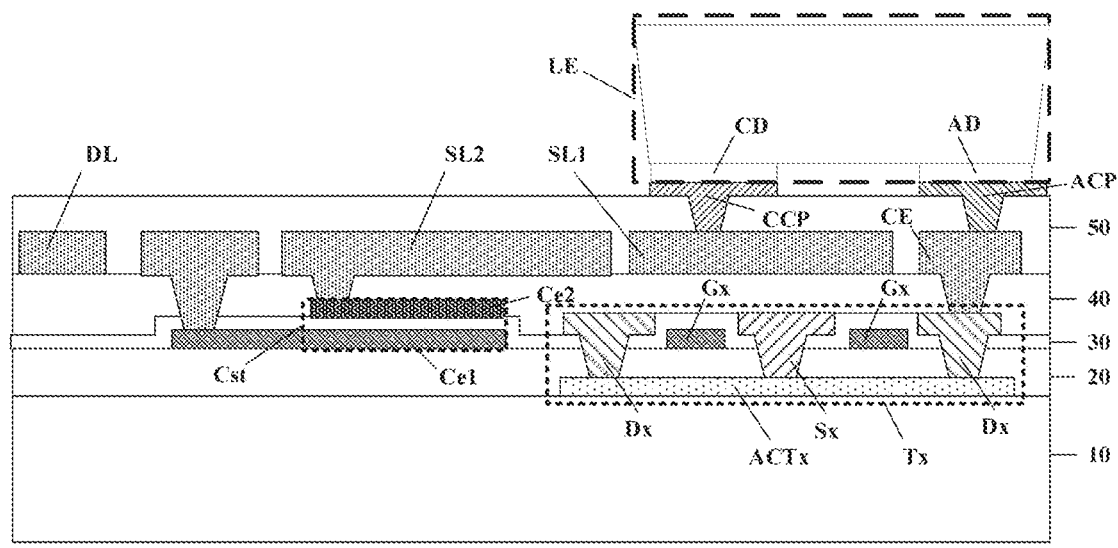
FIG. 12 is a cross-sectional view of a portion of an array substrate in some embodiments according to the present disclosure.
Figure 13:
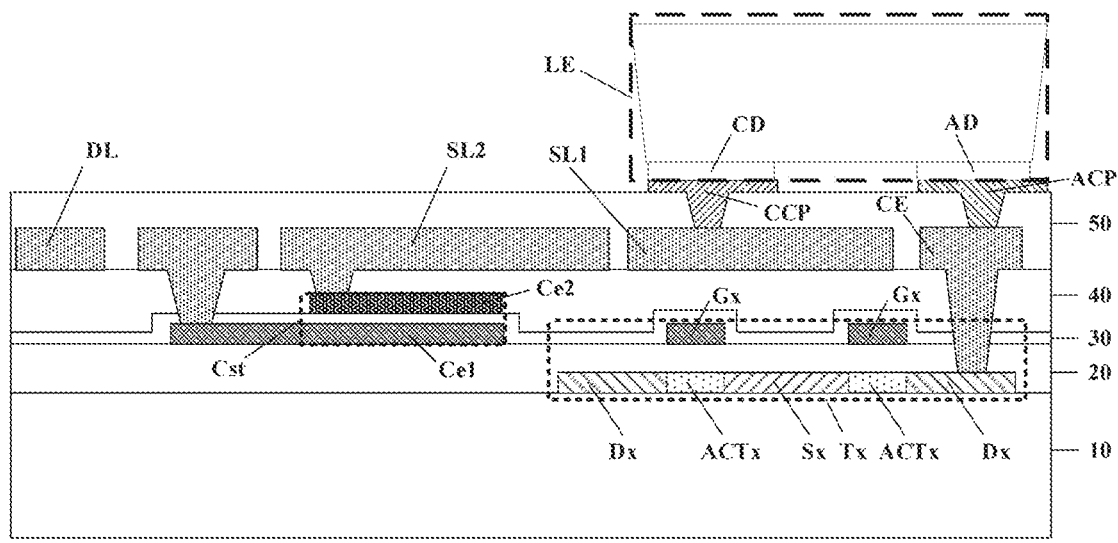
FIG. 13 is a cross-sectional view of a portion of an array substrate in some embodiments according to the present disclosure.

FIG. 12 is a cross-sectional view of a portion of an array substrate in some embodiments according to the present disclosure. FIG. 13 is a cross-sectional view of a portion of an array substrate in some embodiments according to the present disclosure. Referring to FIG. 12 and FIG. 13, in some embodiments, the array substrate further includes a light emitting element LE such as a micro light emitting diode. In some embodiments, the light emitting element LE includes an N-pad CD and a P-pad AD. The N-pad CD is bonded to the cathode contact pad CCP, and the P-pad AD is bonded to the anode contact pad ACP. In some embodiments, the light emitting element LE further includes a first type doped semiconductor layer; a quantum-well layer; and a second type doped semiconductor layer.

Optionally, the first type doped semiconductor layer is formed using a P-doped semiconductor material, and the second type doped semiconductor layer is formed using an N-doped semiconductor material. Optionally, the first type doped semiconductor layer is formed using an N-doped semiconductor material, and the second type doped semiconductor layer is formed using a P-doped semiconductor material. In one example, the P-doped semiconductor materials include p-GaN. In another example, the N-doped semiconductor materials include N-GaN. Optionally, the quantum-well layer includes multiple quantum wells (MQW). In one example, the quantum-well layer includes a single layer having multiple quantum wells. In another example, the quantum-well layer includes multiple sublayers having multiple quantum wells. Optionally, the first type doped semiconductor layer, the quantum-well layer, and the second type doped semiconductor layer are independently formed by metal organic chemical vapor deposition.

Optionally, the light emitting element LE includes a first type doped semiconductor layer, a second type doped semiconductor layer, a quantum-well layer connecting the first type doped semiconductor layer and the second type doped semiconductor layer, an N-pad CD electrically connected to the first type doped semiconductor layer, and a P-pad AD electrically connected to the second type doped semiconductor layer. Optionally, the N-pad CD is in direct contact with the cathode contact pad CCP, and the P-pad AD is in direct contact with the anode contact pad ACP.

Referring to FIGS. 2, 5, 8, 11, 12, and 13, in some embodiments, the storage capacitor Cst includes a first capacitor electrode Ce1, a second capacitor electrode Ce2, and an insulating layer 30 between the first capacitor electrode Ce1 and the second capacitor electrode Ce2. The first capacitor electrode Ce1 is connected to a gate electrode of the driving transistor Td. The second capacitor electrode Ce2 is connected to a voltage power source. In one example, the voltage power source is a high voltage power source such as the second voltage supply line SL2 (e.g., a high voltage supply line Vdd).

Figure 14:
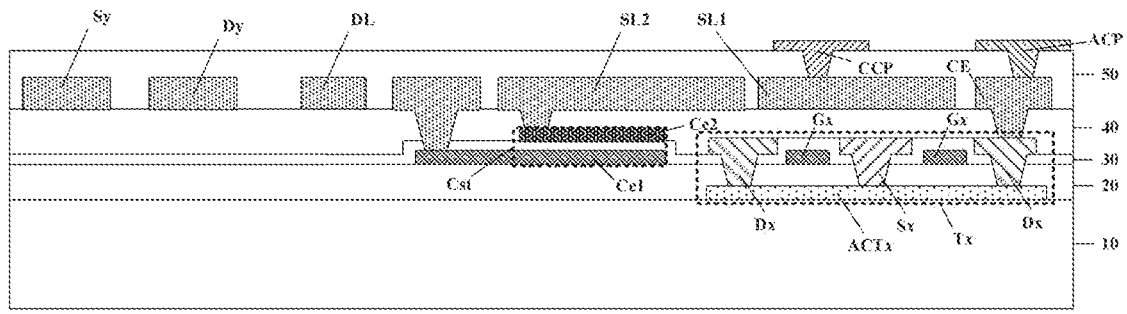
FIG. 14 is a cross-sectional view of a portion of an array substrate in some embodiments according to the present disclosure.

FIG. 14 is a cross-sectional view of a portion of an array substrate in some embodiments according to the present disclosure. Referring to FIG. 14, in some embodiments, a source electrode Sy and a drain electrode Dy of the at least one transistor in the first group, the data line DL, the second voltage supply line SL2, and the first voltage supply line SL1 are in a same layer. The source electrode Sx and the drain electrode Dx of the at least one of the one or more transistors in a second group are in a layer different from the source electrode Sy and the drain electrode Dy of the at least one transistor in the first group.

Referring to FIGS. 2, 5, 8, and 11-14, in some embodiments, the inter-layer dielectric layer 40 is on a side of the second capacitor electrode Ce2 of the storage capacitor Cst away from the insulating layer 30, and the inter-layer dielectric layer 40 is in direct contact with the second capacitor electrode Ce2 of the storage capacitor Cst. The second voltage supply line SL2 and the first voltage supply line SL1, the source electrode Sy and the drain electrode Dy of the at least one transistor in the first group, and the data line DL are in direct contact with the inter-layer dielectric layer 40, and are on a side of the inter-layer dielectric layer 40 away from the second capacitor electrode Ce2 of the storage capacitor Cst.

Referring to FIGS. 2, 5, 8, and 11-14, in some embodiments, the source electrode Sy and the drain electrode Dy of the at least one transistor in the first group, the data line DL, the second voltage supply line SL2, the first voltage supply line SL1, and the connecting electrode CE are in a same layer. The connecting electrode CE connects the drain electrode Dx of one of the one or more transistors in a second group to the anode contact pad ACP. In one example, and referring to FIG. 2, the one of the one or more transistors in a second group is the output transistor Ts, and the connecting electrode CE connects the drain electrode of the output transistor Ts to the anode contact pad ACP.

Referring to FIGS. 2, 5, 8, and 11-14, in some embodiments, the inter-layer dielectric layer 40 is on a side of the second capacitor electrode Ce2 of the storage capacitor Cst away from the insulating layer 30, and is in direct contact with the second capacitor electrode Ce2 of the storage capacitor Cst. The second voltage supply line SL2, the first voltage supply line SL1, the source electrode Sy and the drain electrode Dy of the at least one transistor in the first group, the data line DL, and the connecting electrode CE are in direct contact with the inter-layer dielectric layer 40, and are on a side of the inter-layer dielectric layer 40 away from the second capacitor electrode Ce2 of the storage capacitor Cst.

Referring to FIGS. 2, 5, 8, and 11-14, in some embodiments, the planarization layer 50 is on a side of the second voltage supply line SL2 and the first voltage supply line SL1, the source electrode Sy and the drain electrode Dy of the at least one transistor in the first group, the data line DL, and the connecting electrode CE away from the inter-layer dielectric layer 40. The cathode contact pad CCP is on a side of the planarization layer 50 away from the first voltage supply line SL1, and extends through the planarization layer 50 to connect to the first voltage supply line SL1. The anode contact pad ACP is on a side of the planarization layer 50 away from the connecting electrode CE, and extends through the planarization layer 50 to connect to the connecting electrode CE. The planarization layer 50 is in direct contact with the cathode contact pad CCP and the anode contact pad ACP on a first side, and is in direct contact with, on a second side opposite to the first side, the second voltage supply line SL2, the first voltage supply line SL1, the source electrode Sy and the drain electrode Dy of the at least one transistor in the first group, the data line DL, and the connecting electrode CE.

In some embodiments, a source electrode and a drain electrode of any one of the fourth transistor T4, the fifth transistor T5, the driving transistor Td, and the output transistor Ts are in a layer different from the source electrode Sy and the drain electrode Dy of the at least one transistor in the first group. Optionally, source electrodes and drain electrodes of all of the fourth transistor T4, the fifth transistor T5, the driving transistor Td, and the output transistor Ts are in a layer different from the source electrode Sy and the drain electrode Dy of the at least one transistor in the first group. Optionally, source electrodes and drain electrodes of all of the fourth transistor T4, the fifth transistor T5, the driving transistor Td, and the output transistor Ts are in a same layer.

Referring to FIGS. 2, 5, 8, and 11-14, in some embodiments, the inter-layer dielectric layer 40 is on a side of the second capacitor electrode Ce2 of the storage capacitor Cst away from the insulating layer 30, and is in direct contact with the second capacitor electrode Ce2 of the storage capacitor Cst. The planarization layer 50 is on a side of the second voltage supply line SL2 and the first voltage supply line SL1, the source electrode Sy and the drain electrode Dy of the at least one transistor in the first group, the data line DL, and the connecting electrode CE away from the inter-layer dielectric layer 40. The cathode contact pad CCP is on a side of the planarization layer 50 away from the first voltage supply line SL1, and extends through the planarization layer 50 to connect to the first voltage supply line SL1. The anode contact pad ACP is on a side of the planarization layer 50 away from the connecting electrode CE, and extends through the planarization layer 50 to connect to a connecting electrode CE. The source electrode Sy and the drain electrode Dy of the at least one transistor in the first group, the data line DL, the second voltage supply line SL2, the first voltage supply line SL1, and the connecting electrode CE are in a same layer. The connecting electrode CE connects the drain electrode Dx of one of the one or more transistors in a second group to the anode contact pad ACP. The second voltage supply line SL2 and the first voltage supply line SL1, the source electrode Sy and the drain electrode Dy of the at least one transistor in the first group, the data line DL, and the connecting electrode CE are in direct contact with the inter-layer dielectric layer 40, and are on a side of the inter-layer dielectric layer 40 away from the second capacitor electrode Ce2 of the storage capacitor Cst. The planarization layer 50 is in direct contact with the cathode contact pad CCP and the anode contact pad ACP on a first side, and is in direct contact with, on a second side opposite to the first side, the second voltage supply line SL2 and the first voltage supply line SL1, the source electrode Sy and the drain electrode Dy of the at least one transistor in the first group, the data line DL, and the connecting electrode CE. The N-pad CD is in direct contact with the cathode contact pad CCP, and the P-pad AD is in direct contact with the anode contact pad ACP.

Referring to FIGS. 5, 8, and 11-14, in some embodiments, the transistor Tx is an output transistor Ts in FIG. 2.

In another aspect, the present invention provides a method of fabricating an array substrate. In some embodiments, the method includes forming a data line; forming a first voltage supply line; forming a second voltage supply line; and forming a pixel driving circuit. In some embodiments, forming the pixel driving circuit includes forming one or more transistors in a first group and forming one or more transistors in a second group. Optionally, a source electrode and a drain electrode of the at least one transistor in the first group, the data line, the second voltage supply line, and the first voltage supply line are formed in a same layer using a same material and a same mask plate. Optionally, a source electrode and a drain electrode of at least one transistor in the second group are formed in a layer different from the first voltage supply line and the second voltage supply line.

In some embodiments, forming the pixel driving circuit further includes forming a storage capacitor. In some embodiments, forming the storage capacitor includes forming a first capacitor electrode, forming a second capacitor electrode, and forming an insulating layer between the first capacitor electrode and the second capacitor electrode. Optionally, the second group comprises a driving transistor. Optionally, the first capacitor electrode is connected to a gate electrode of the driving transistor. Optionally, the second capacitor electrode is connected to a voltage power source.

In some embodiments, the method further includes forming an anode contact pad; forming a cathode contact pad; and forming a connecting electrode that connects a drain electrode of one of the one or more transistors in a second group to an anode contact pad. Optionally, the source electrode and the drain electrode of the at least one transistor in the first group, the data line, the second voltage supply line, the first voltage supply line, and the connecting electrode are formed in a same layer using a same material and a same mask plate.

Optionally, the source electrode and the drain electrode of the at least one of the one or more transistors in a second group, and the second capacitor electrode are formed in a same layer using a same material and a same mask plate.

Optionally, the source electrode and the drain electrode of the at least one of the one or more transistors in a second group, and an active layer of the at least one of the one or more transistors in a second group, are formed in a same layer using a same semiconductor material and a same mask plate.

In some embodiments, the method further includes forming an inter-layer dielectric layer on a side of the second capacitor electrode away from the insulating layer, and in direct contact with the second capacitor electrode; forming a connecting electrode; forming a planarization layer on a side of the second voltage supply line and the first voltage supply line, the source electrode and the drain electrode of the at least one transistor in the first group, the data line, and the connecting electrode away from the inter-layer dielectric layer; forming a cathode contact pad on a side of the planarization layer away from the first voltage supply line, and extending through the planarization layer to connect to the first voltage supply line; forming an anode contact pad on a side of the planarization layer away from the connecting electrode, and extending through the planarization layer to connect to the connecting electrode; and forming a micro light emitting diode (micro LED) on a side of the cathode contact pad and the anode contact pad away from the base substrate. Optionally, the source electrode and the drain electrode of the at least one transistor in the first group, the data line, the second voltage supply line, the first voltage supply line, and the connecting electrode are formed in a same layer using a same material and a same mask plate. Optionally, the connecting electrode connects a drain electrode of one of the one or more transistors in a second group to the anode contact pad. Optionally, the second voltage supply line and the first voltage supply line, the source electrode and the drain electrode of the at least one transistor in the first group, the data line, and the connecting electrode are formed to be in direct contact with the inter-layer dielectric layer, and are formed on a side of the inter-layer dielectric layer away from the second capacitor electrode. Optionally, the planarization layer is formed to be in direct contact with the cathode contact pad and the anode contact pad on a first side, and is formed to be in direct contact with, on a second side opposite to the first side, the second voltage supply line and the first voltage supply line, the source electrode and the drain electrode of the at least one transistor in the first group, the data line, and the connecting electrode. Optionally, forming the micro LED includes forming a micro LED precursor unit. Optionally, forming the micro LED precursor unit includes forming a first type doped semiconductor layer, forming a second type doped semiconductor layer, a forming quantum-well layer connecting the first type doped semiconductor layer and the second type doped semiconductor layer, forming an N-pad electrically connected to the first type doped semiconductor layer, and forming a P-pad electrically connected to the second type doped semiconductor layer. Optionally, the method further includes transferring the micro LED precursor unit on a side of the planarization layer away from the first voltage supply line and the connecting electrode, bonding the N-pad to the cathode contact pad and bonding the P-pad to the anode contact pad. Optionally, the N-pad is in direct contact with the cathode contact pad, and the P-pad is in direct contact with the anode contact pad.

Figure 15A:
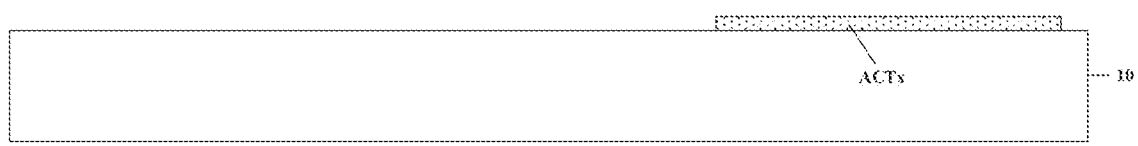
FIGS. 15A to 15G illustrate a method of fabricating an array substrate in some embodiments according to the present disclosure.

FIGS. 15A to 15G illustrate a method of fabricating an array substrate in some embodiments according to the present disclosure. Referring to FIG. 15A, an active layer ACTx of the transistor Tx (the at least one of the one or more transistors in a second group) is formed on the base substrate 10. Various appropriate semiconductor materials and various appropriate fabricating methods may be used to make the active layer. For example, a semiconductor material may be deposited on the substrate by a plasma-enhanced chemical vapor deposition (PECVD) process. Examples of appropriate semiconductor materials for making the active layer includes, but are not limited to, metal oxides (e.g., ITO, IZTO, IGTO), amorphous silicon, polycrystalline silicon, etc.

Figure 15B:
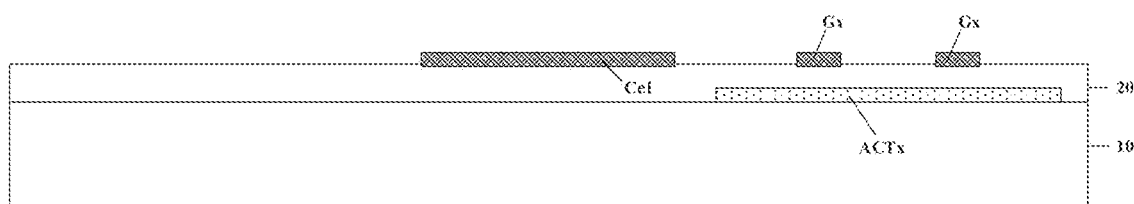

Referring to FIG. 15B, a gate insulating layer 20 is formed on a side of the active layer ACTx away from the base substrate 10; a gate electrode Gx of the transistor Tx and a first capacitor electrode Ce1 of the storage capacitor Cst are formed on a side of the gate insulating layer 20 away from the active layer ACTx. The gate electrode Gx of the transistor Tx and the first capacitor electrode Ce1 of the storage capacitor Cst are formed in a same layer using a same material and a same mask plate. Various appropriate electrode materials and various appropriate fabricating methods may be used to make the gate electrode Gx of the transistor Tx and the first capacitor electrode Ce1 of the storage capacitor Cst. For example, an electrode material may be deposited on the substrate by a plasma-enhanced chemical vapor deposition (PECVD) process and patterned. Examples of appropriate electrode materials for making the gate electrode Gx of the transistor Tx and the first capacitor electrode Ce1 of the storage capacitor Cst include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like.

Figure 15C:
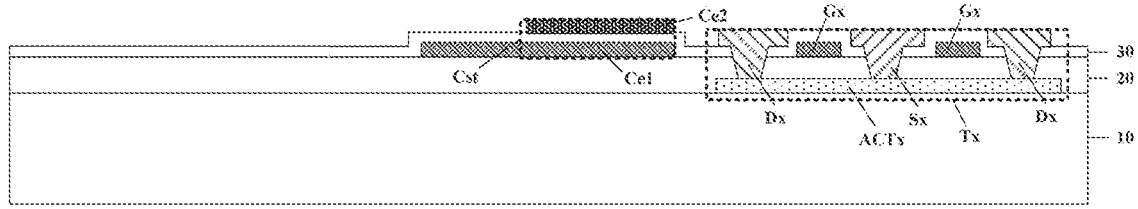

Referring to FIG. 15C, an insulating layer 30 is formed on a side of the gate electrode Gx and the first capacitor electrode Ce1 of the storage capacitor Cst away from the base substrate 10; a second capacitor electrode Ce2 of the storage capacitor Cst, a source electrode Sx and a drain electrode Dx of the transistor Tx are formed on a side of the insulating layer 30 away from the base substrate 10. The second capacitor electrode Ce2 of the storage capacitor Cst, the source electrode Sx and the drain electrode Dx of the transistor Tx are formed in a same layer using a same material and a same mask plate. Various appropriate electrode materials and various appropriate fabricating methods may be used to make the second capacitor electrode Ce2 of the storage capacitor Cst, the source electrode Sx and the drain electrode Dx of the transistor Tx. For example, an electrode material may be deposited on the substrate by a plasma-enhanced chemical vapor deposition (PECVD) process and patterned. Examples of appropriate electrode materials for making the second capacitor electrode Ce2 of the storage capacitor Cst, the source electrode Sx and the drain electrode Dx of the transistor Tx include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like.

Figure 15D:
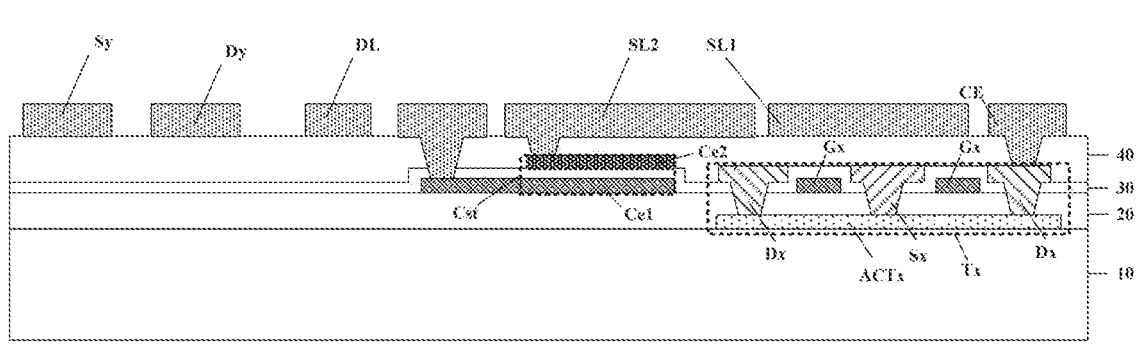

Referring to FIG. 15D, an inter-layer dielectric layer 40 is formed on a side of the second capacitor electrode Ce2 of the storage capacitor Cst away from the base substrate 10, the source electrode Sx and the drain electrode Dx of the transistor Tx, away from the base substrate 10; a data line DL, a first voltage supply line SL1, a second voltage supply line SL2, a connecting electrode CE, a source electrode Sy and a drain electrode Dy of the at least one transistor in the first group on a side of the inter-layer dielectric layer 40 away from the base substrate 10. The data line DL, the first voltage supply line SL1, the second voltage supply line SL2, the connecting electrode CE, the source electrode Sy and the drain electrode Dy of the at least one transistor in the first group are formed in a same layer using a same material and a same mask plate. The connecting electrode CE is formed to extend through the inter-layer dielectric layer 40 to connect to the drain electrode Dx of the transistor Tx. The second voltage supply line SL2 is formed to extend through the inter-layer dielectric layer 40 to connect to the second capacitor electrode Ce2 of the storage capacitor Cst. Various appropriate electrode materials and various appropriate fabricating methods may be used to make the data line DL, the first voltage supply line SL1, the second voltage supply line SL2, the connecting electrode CE, the source electrode Sy and the drain electrode Dy of the at least one transistor in the first group. For example, an electrode material may be deposited on the substrate by a plasma-enhanced chemical vapor deposition (PECVD) process and patterned. Examples of appropriate electrode materials for making the data line DL, the first voltage supply line SL1, the second voltage supply line SL2, the connecting electrode CE, the source electrode Sy and the drain electrode Dy of the at least one transistor in the first group include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like.

Figure 15E:
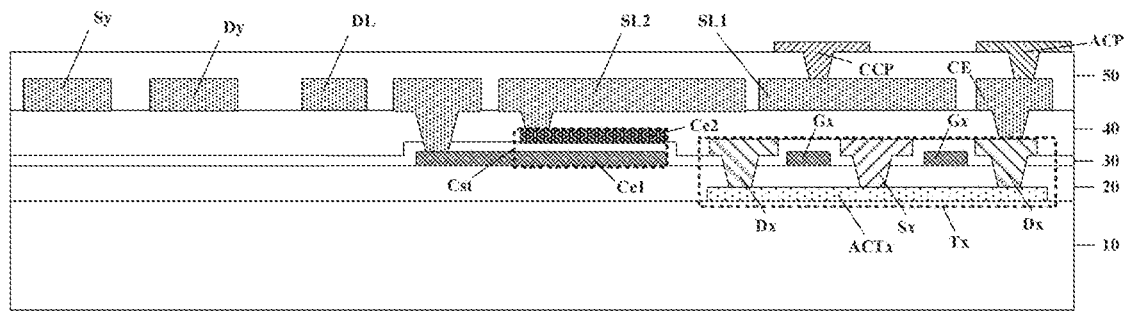

Referring to FIG. 15E, a planarization layer 50 is formed on a side of the data line DL, the first voltage supply line SL1, the second voltage supply line SL2, the connecting electrode CE, and the source electrode Sy and the drain electrode Dy of the at least one transistor in the first group away from the base substrate 10; and an anode contact pad ACP and a cathode contact pad CCP are formed on a side of the planarization layer 50 away from the base substrate 10. The anode contact pad ACP is formed to extend through the planarization layer 50 to connect to the connecting electrode CE, the cathode contact pad CCP is formed to extend through the planarization layer 50 to connect to the first voltage supply line SL1. Various appropriate conductive materials and various appropriate fabricating methods may be used to make the anode contact pad ACP and the cathode contact pad CCP. For example, a conductive material may be deposited on the substrate by a plasma-enhanced chemical vapor deposition (PECVD) process and patterned. Examples of appropriate conductive materials for making the anode contact pad ACP and the cathode contact pad CCP include, but are not limited to, various metals, various alloys, and various conductive metal oxides (e.g., indium tin oxide).

Figure 15F:
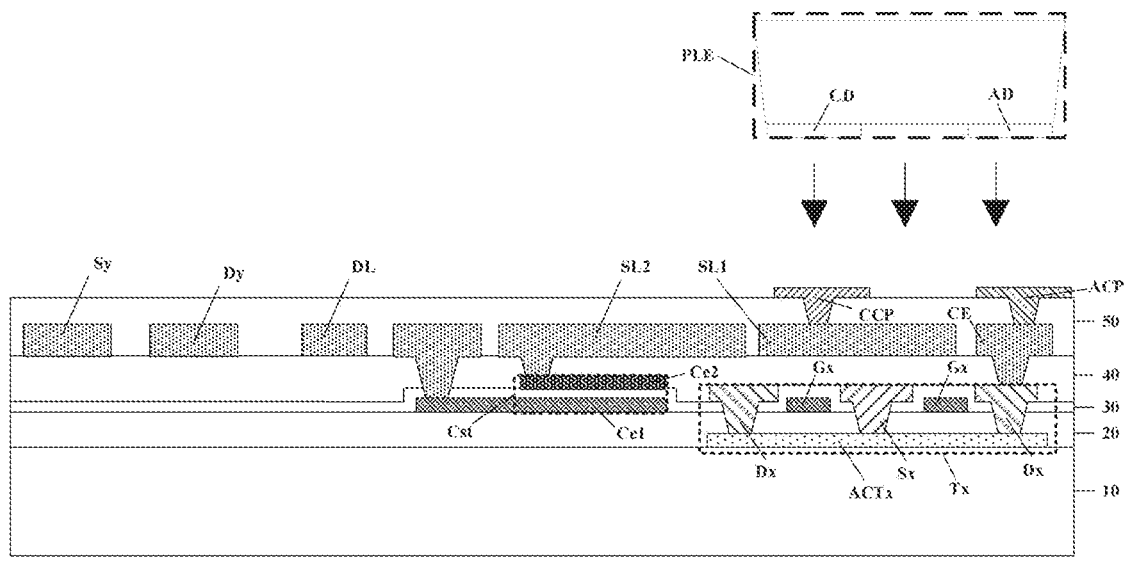

Referring to FIG. 15F, a micro LED precursor unit PLE is transferred on side of the planarization layer 50 away from the first voltage supply line SL1 and the connecting electrode CE. The micro LED precursor unit PLE is then bonded to the anode contact pad ACP and the cathode contact pad CCP. For example, an N-pad CD of the micro LED precursor unit PLE is bonded to the cathode contact pad CCP, and a P-pad AD of the micro LED precursor unit PLE is bonded to the anode contact pad ACP.

Figure 15G:
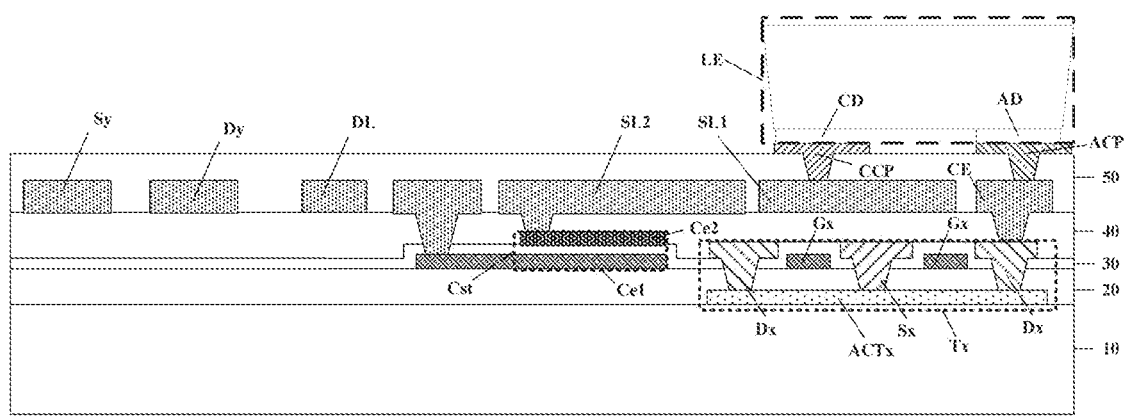

Referring to FIG. 15G, the light emitting element LE (e.g., a micro LED) is formed on the array substrate. The N-pad CD of the light emitting element LE is in direct contact with the cathode contact pad CCP, and the P-pad AD of the light emitting element LE is in direct contact with the anode contact pad ACP.

In another aspect, the present invention provides a display apparatus, including the array substrate described herein or fabricated by a method described herein, and one or more integrated circuits connected to the array substrate. Examples of appropriate display apparatuses include, but are not limited to, an electronic paper, a mobile phone, a tablet computer, a television, a monitor, a notebook computer, a digital album, a GPS, etc. Optionally, the display apparatus further includes one or more integrated circuits connected to the display panel.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising:
   a data line;
   a first voltage supply line;
   a second voltage supply line; and
   a pixel driving circuit;
   wherein the pixel driving circuit comprises one or more transistors in a first group and one or more transistors in a second group;
   wherein a source electrode and a drain electrode of at least one transistor in the first group, the data line, the first voltage supply line, and the second voltage supply line are in a same layer; and
   a source electrode and a drain electrode of at least one transistor in the second group are in a layer different from the first voltage supply line and the second voltage supply line;
   wherein the pixel driving circuit further comprises a storage capacitor;
   the storage capacitor comprises a first capacitor electrode, a second capacitor electrode, and an insulating layer between the first capacitor electrode and the second capacitor electrode;
   the second group comprises a driving transistor;
   the first capacitor electrode is connected to a gate electrode of the driving transistor; and
   the second capacitor electrode is connected to a voltage power source.

2. The array substrate of claim 1, further comprising an inter-layer dielectric layer on a side of the second capacitor electrode away from the insulating layer, and in direct contact with the second capacitor electrode;
   wherein the first voltage supply line and the second voltage supply line, the source electrode and the drain electrode of the at least one transistor in the first group, and the data line are in direct contact with the inter-layer dielectric layer, and are on a side of the inter-layer dielectric layer away from the second capacitor electrode.

3. The array substrate of claim 1, wherein the source electrode and the drain electrode of the at least one transistor in the first group, the data line, the second voltage supply line, the first voltage supply line, and a connecting electrode are in a same layer;
   the second group comprises an output transistor; and
   the connecting electrode connects a drain electrode of the output transistor in the second group to an anode contact pad.

4. The array substrate of claim 3, further comprising an inter-layer dielectric layer on a side of the second capacitor electrode away from the insulating layer, and in direct contact with the second capacitor electrode;
   wherein the first voltage supply line, the second voltage supply line, the source electrode and the drain electrode of the at least one transistor in the first group, the data line, and the connecting electrode are in direct contact with the inter-layer dielectric layer, and are on a side of the inter-layer dielectric layer away from the second capacitor electrode.

5. The array substrate of claim 4, further comprising:
   a planarization layer on a side of the second voltage supply line and the first voltage supply line, the source electrode and the drain electrode of the at least one transistor in the first group, the data line, and the connecting electrode away from the inter-layer dielectric layer;
   a cathode contact pad on a side of the planarization layer away from the first voltage supply line, and extending through the planarization layer to connect to the first voltage supply line; and
   an anode contact pad on a side of the planarization layer away from the connecting electrode, and extending through the planarization layer to connect to the connecting electrode;
   wherein the planarization layer is in direct contact with the cathode contact pad and the anode contact pad on a first side, and is in direct contact with, on a second side opposite to the first side, the first voltage supply line, the second voltage supply line, the source electrode and the drain electrode of the at least one transistor in the first group, the data line, and the connecting electrode.

6. The array substrate of claim 1, wherein the source electrode and the drain electrode of the at least one transistor in the second group are in a same layer as the second capacitor electrode.

7. The array substrate of claim 1, wherein the pixel driving circuit comprises a current modulating sub-circuit and a duration modulating sub-circuit;
   wherein the current modulating sub-circuit is configured to generate a compensated current signal based on a data signal, and transmit the compensated current signal to the duration modulating sub-circuit; and
   the duration modulating sub-circuit is configured to receive the compensated current signal from the current modulating sub-circuit, and control an electrical component connected to the duration modulating sub-circuit based on time integration of the compensated current signal.

8. The array substrate of claim 7, wherein the current modulating sub-circuit comprises:
   the driving transistor;
   the storage capacitor;
   a first transistor having a gate electrode connected to a reset control signal line, a source electrode connected to a reset signal line, and a drain electrode connected to the first capacitor electrode and the gate electrode of the driving transistor;
   a second transistor having a gate electrode connected to a first gate line, a source electrode connected to the data line, and a drain electrode connected to a source electrode of the driving transistor;
   a third transistor having a gate electrode connected to the first gate line, a source electrode connected to the first capacitor electrode and the gate electrode of the driving transistor, and a drain electrode connected to a drain electrode of the driving transistor;
   a fourth transistor having a gate electrode connected to a light emitting control signal line, a source electrode connected to the second voltage supply line, and a drain electrode connected to the source electrode of the driving transistor and the drain electrode of the second transistor; and a fifth transistor having a gate electrode connected to the light emitting control signal line, a source electrode connected to drain electrodes of the driving transistor and the third transistor, and a drain electrode connected to the duration modulating sub-circuit;

wherein the duration modulating sub-circuit comprises:

an output transistor having a source electrode connected to the drain electrode of the fifth transistor, and a drain electrode connected to a connecting electrode;

a sixth transistor having a gate electrode connected to a second gate line, a source electrode connected to the data line, a drain electrode connected to a gate electrode of the output transistor; and a capacitor having a first electrode connected to the drain electrode of the sixth transistor and the gate electrode of the output transistor, and a second electrode configured to be provided with a common voltage.

9. The array substrate of claim 8, wherein a source electrode and a drain electrode of any one of the driving transistor, the fourth transistor, the fifth transistor, and the output transistor are in a layer different from the first voltage supply line and the second voltage supply line.

10. The array substrate of claim 9, wherein source electrodes and drain electrodes of the driving transistor, the fourth transistor, the fifth transistor, and the output transistor are in a layer different from the first voltage supply line and the second voltage supply line.

11. The array substrate of claim 1, further comprising a micro light emitting diode (micro LED) connected to the pixel driving circuit.

12. The array substrate of claim 11, further comprising:

an inter-layer dielectric layer on a side of the second capacitor electrode away from the insulating layer, and in direct contact with the second capacitor electrode;

a planarization layer on a side of the first voltage supply line and the second voltage supply line, the source electrode and the drain electrode of the at least one transistor in the first group, the data line, and the connecting electrode away from the inter-layer dielectric layer;

a cathode contact pad on a side of the planarization layer away from the first voltage supply line, and extending through the planarization layer to connect to the first voltage supply line; and an anode contact pad on a side of the planarization layer away from the connecting electrode, and extending through the planarization layer to connect to a connecting electrode;

wherein the source electrode and the drain electrode of the at least one transistor in the first group, the data line, the second voltage supply line, the first voltage supply line, and the connecting electrode are in a same layer;

the second group comprises an output transistor;

the connecting electrode connects a drain electrode of the output transistor to the anode contact pad;

the first voltage supply line and the second voltage supply line, the source electrode and the drain electrode of the at least one transistor in the first group, the data line, and the connecting electrode are in direct contact with the inter-layer dielectric layer, and are on a side of the inter-layer dielectric layer away from the second capacitor electrode; and the planarization layer is in direct contact with the cathode contact pad and the anode contact pad on a first side, and is in direct contact with, on a second side opposite to the first side, the first voltage supply line and the second voltage supply line, the source electrode and the drain electrode of the at least one transistor in the first group, the data line, and the connecting electrode;

wherein the micro LED comprises a first type doped semiconductor layer, a second type doped semiconductor layer, a quantum-well layer connecting the first type doped semiconductor layer and the second type doped semiconductor layer, an N-pad electrically connected to the first type doped semiconductor layer, and a P-pad electrically connected to the second type doped semiconductor layer;

wherein the N-pad is in direct contact with the cathode contact pad, and the P-pad is in direct contact with the anode contact pad.

13. A display apparatus, comprising the array substrate of claim 1, and one or more integrated circuits connected to the array substrate.

14. An array substrate, comprising:

a data line;

a first voltage supply line;

a second voltage supply line; and a pixel driving circuit;

wherein the pixel driving circuit comprises one or more transistors in a first group and one or more transistors in a second group;

wherein a source electrode and a drain electrode of at least one transistor in the first group, the data line, the first voltage supply line, and the second voltage supply line are in a same layer; and a source electrode and a drain electrode of at least one transistor in the second group are in a layer different from the first voltage supply line and the second voltage supply line;

wherein the source electrode and the drain electrode of the at least one transistor in the second group are in a same layer as an active layer of the at least one transistor in the second group, and are made of a semiconductor material.

15. A method of fabricating an array substrate, comprising:

forming a data line;

forming a first voltage supply line;

forming a second voltage supply line; and forming a pixel driving circuit;

wherein forming the pixel driving circuit comprises forming one or more transistors in a first group and forming one or more transistors in a second group;

wherein a source electrode and a drain electrode of at least one transistor in the first group, the data line, the second voltage supply line, and the first voltage supply line are formed in a same layer using a same material and a same mask plate; and a source electrode and a drain electrode of at least one transistor in the second group are formed in a layer different from the first voltage supply line and the second voltage supply line;

wherein forming the pixel driving circuit further comprises forming a storage capacitor;

forming the storage capacitor comprises forming a first capacitor electrode, forming a second capacitor electrode, and forming an insulating layer, the insulating layer formed between the first capacitor electrode and the second capacitor electrode;

the second group comprises a driving transistor;

the first capacitor electrode is connected to a gate electrode of the driving transistor; and the second capacitor electrode is connected to a voltage power source.

16. The method of claim 15, further comprising:

forming an anode contact pad;

forming a cathode contact pad; and forming a connecting electrode that connects a drain electrode of an output transistor in the second group to the anode contact pad;

wherein the source electrode and the drain electrode of the at least one transistor in the first group, the data line, the second voltage supply line, the first voltage supply line, and the connecting electrode are formed in a same layer using a same material and a same mask plate.

17. The method of claim 15, wherein the source electrode and the drain electrode of the at least one transistor in the second group, and an active layer of the at least one transistor in the second group, are formed in a same layer using a same semiconductor material and a same mask plate.

18. The method of claim 15, further comprising:

forming an inter-layer dielectric layer on a side of the second capacitor electrode away from the insulating layer, and in direct contact with the second capacitor electrode;

forming a connecting electrode;

forming a planarization layer on a side of the second voltage supply line and the first voltage supply line, the source electrode and the drain electrode of the at least one transistor in the first group, the data line, and the connecting electrode away from the inter-layer dielectric layer;

forming a cathode contact pad on a side of the planarization layer away from the first voltage supply line, and extending through the planarization layer to connect to the first voltage supply line;

forming an anode contact pad on a side of the planarization layer away from the connecting electrode, and extending through the planarization layer to connect to the connecting electrode; and forming a micro light emitting diode (micro LED) on a side of the cathode contact pad and the anode contact pad away from a base substrate;

wherein the source electrode and the drain electrode of the at least one transistor in the first group, the data line, the second voltage supply line, the first voltage supply line, and the connecting electrode are formed in a same layer using a same material and a same mask plate;

the second group comprises an output transistor;

the connecting electrode connects a drain electrode of the output transistor to the anode contact pad;

the first voltage supply line and the second voltage supply line, the source electrode and the drain electrode of the at least one transistor in the first group, the data line, and the connecting electrode are formed to be in direct contact with the inter-layer dielectric layer, and are formed on a side of the inter-layer dielectric layer away from the second capacitor electrode; and the planarization layer is formed to be in direct contact with the cathode contact pad and the anode contact pad on a first side, and is formed to be in direct contact with, on a second side opposite to the first side, the second voltage supply line and the first voltage supply line, the source electrode and the drain electrode of the at least one transistor in the first group, the data line, and the connecting electrode;

wherein forming the micro LED comprises forming a micro LED precursor unit;

wherein forming the micro LED precursor unit comprises forming a first type doped semiconductor layer, forming a second type doped semiconductor layer, a forming quantum-well layer connecting the first type doped semiconductor layer and the second type doped semiconductor layer, forming an N-pad electrically connected to the first type doped semiconductor layer, and forming a P-pad electrically connected to the second type doped semiconductor layer;

wherein the method further comprises transferring the micro LED precursor unit on a side of the planarization layer away from the first voltage supply line and the connecting electrode; and bonding the N-pad to the cathode contact pad and bonding the P-pad to the anode contact pad;

wherein the N-pad is in direct contact with the cathode contact pad, and the P-pad is in direct contact with the anode contact pad.

* * * * *